(12) United States Patent
Kodama et al.

(10) Patent No.: US 9,754,949 B2
(45) Date of Patent: Sep. 5, 2017

(54) SEMICONDUCTOR DEVICE AND METHOD OF MANUFACTURING THE SAME

(71) Applicant: Renesas Electronics Corporation, Koutou-ku, Tokyo (JP)

(72) Inventors: Satoshi Kodama, Tokyo (JP); Eiji Hasegawa, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/242,489

(22) Filed: Aug. 20, 2016

(65) Prior Publication Data

US 2017/0062446 A1 Mar. 2, 2017

(30) Foreign Application Priority Data

Aug. 24, 2015 (JP) .................................. 2015-164789

(51) Int. Cl.
*H01L 27/115* (2017.01)
*H01L 27/11521* (2017.01)
*H01L 29/423* (2006.01)

(52) U.S. Cl.
CPC .. *H01L 27/11521* (2013.01); *H01L 29/42328* (2013.01)

(58) Field of Classification Search
CPC ..................... H01L 27/11521; H01L 29/42328
See application file for complete search history.

(56) References Cited

U.S. PATENT DOCUMENTS

2009/0039410 A1 2/2009 Liu et al.

FOREIGN PATENT DOCUMENTS

JP 2009-044164 A 2/2009

*Primary Examiner* — Amar Movva
(74) *Attorney, Agent, or Firm* — Shapiro, Gabor and Rosenberger, PLLC

(57) ABSTRACT

An insulating film made of the same material as that of a gate insulating film is formed so as to cover one sidewall of a control gate on a conducting film for floating gate. By selectively removing the conducting film for floating gate with the insulating film as a mask, a floating gate is formed from the conducting film for floating gate, and a portion of the gate insulating film is exposed at the floating gate. A nitrogen introduced portion is formed by introducing nitrogen into the exposed portion of the gate insulating film. Then, the insulating film is removed to expose an upper surface of a lateral protrusion of the floating gate. An erase gate is formed so as to face the upper surface and a side surface of the lateral protrusion.

7 Claims, 31 Drawing Sheets

SEMICONDUCTOR DEVICE AND METHOD OF MANUFACTURING THE SAME

This nonprovisional application is based on Japanese Patent Application No. 2015-164789 filed on Aug. 24, 2015, with the Japan Patent Office, the entire contents of which are hereby incorporated by reference.

BACKGROUND OF THE INVENTION

Field of the Invention

The present invention relates to semiconductor devices and methods of manufacturing the same.

Description of the Background Art

Examples of nonvolatile flash memories include a split gate memory having a floating gate, a control gate, an erase gate and a select gate. Such a nonvolatile flash memory is disclosed, for example, in Japanese Patent Laying-Open No. 2009-44164.

In this publication, after the control gate is patterned, a spacer oxide layer is formed on sidewalls of the control gate. With this spacer oxide layer as a mask, the floating gate below the control gate and the spacer oxide layer is patterned. The spacer oxide layer is then removed.

In the manufacturing method of the above publication, a gate oxide layer below the floating gate is exposed when the floating gate is patterned. Thus, when the spacer oxide layer is removed after the patterning of the floating gate, the exposed gate oxide layer is also simultaneously removed. As a result, the gate oxide layer below the floating gate erodes in a lateral direction, causing a lateral notch to occur in the gate oxide layer. Due to this notch, a stacked structure of the floating gate and the control gate is supported unstably on a semiconductor substrate by the gate oxide layer.

For this reason, if megasonic cleaning (ultrasonic vibration) is applied in this state in order to effectively remove dirt and dust in acid stripping and acid cleaning steps, the stacked structure of the floating gate and the control gate may collapse with respect to the semiconductor substrate.

SUMMARY OF THE INVENTION

The other problems and new features will become apparent from the description of the present specification and the accompanying drawings.

A method of manufacturing a semiconductor device of one embodiment mainly includes the following steps.

A first sidewall insulating film made of the same material as that of a gate insulating film is formed so as to cover one sidewall of a control gate on a conducting film for floating gate. By selectively removing the conducting film for floating gate with the first sidewall insulating film as a mask, a floating gate is formed from the conducting film for floating gate, and a portion of the gate insulating film is exposed at the floating gate. A first nitrogen introduced portion is formed by introducing nitrogen into the exposed portion of the gate insulating film. After the first nitrogen introduced portion is formed, the first sidewall insulating film is removed to expose an upper surface of a lateral protrusion of the floating gate protruding laterally from a region immediately below the control gate. An erase gate is formed so as to face the upper surface and a side surface of the lateral protrusion.

According to the one embodiment described above, a semiconductor device in which the collapse of a stacked structure of a floating gate and a control gate can be prevented if megasonic cleaning is applied, and a method of manufacturing the same can be realized.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments are described below with reference to the drawings.

First Embodiment

First, each region disposed on a main surface of a semiconductor substrate in a semiconductor device of this embodiment is described with reference to FIG. 1.

Figure 1:
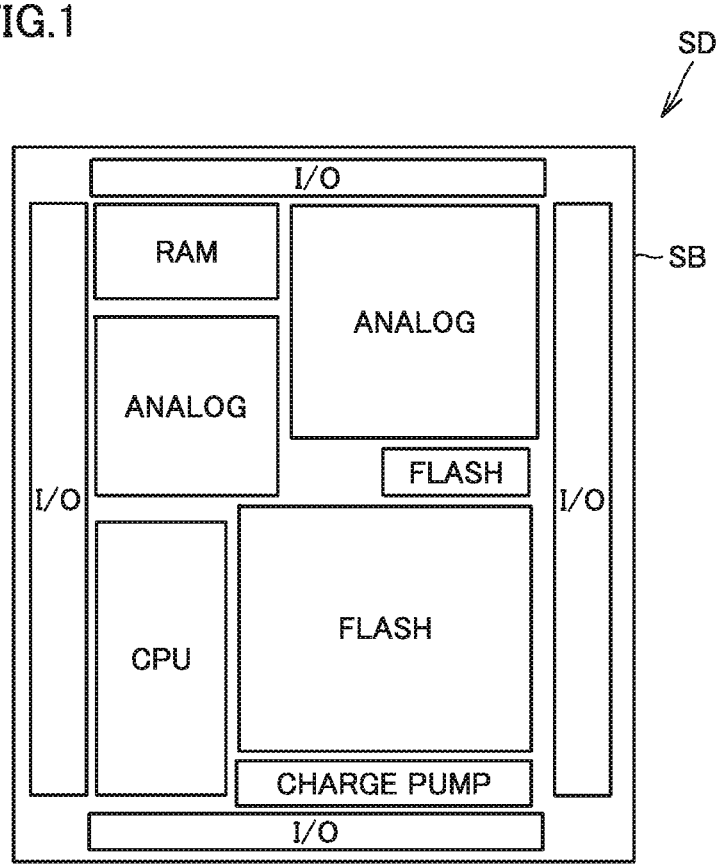
FIG. 1 is a plan view schematically showing the configuration of a semiconductor device in a first embodiment.

As shown in FIG. 1, a semiconductor device SD in this embodiment is in the form of a chip, for example. Alternatively, semiconductor device SD in this embodiment may be in the form of a wafer, or in the form of a resin-sealed package.

Semiconductor device SD in this embodiment mainly has, on the surface of a semiconductor substrate SB, an I/O (Input/Output) region, an ANALOG region, a RAM (Random Access Memory) region, a CPU (Central Processing Unit) region, a charge pump region, and a flash memory region, for example.

In the flash memory region, a plurality of nonvolatile flash memory cells are arranged in columns.

Next, the configuration of each of the nonvolatile flash memory cells in this embodiment is described with reference to FIGS. 2 and 3.

Figure 2:
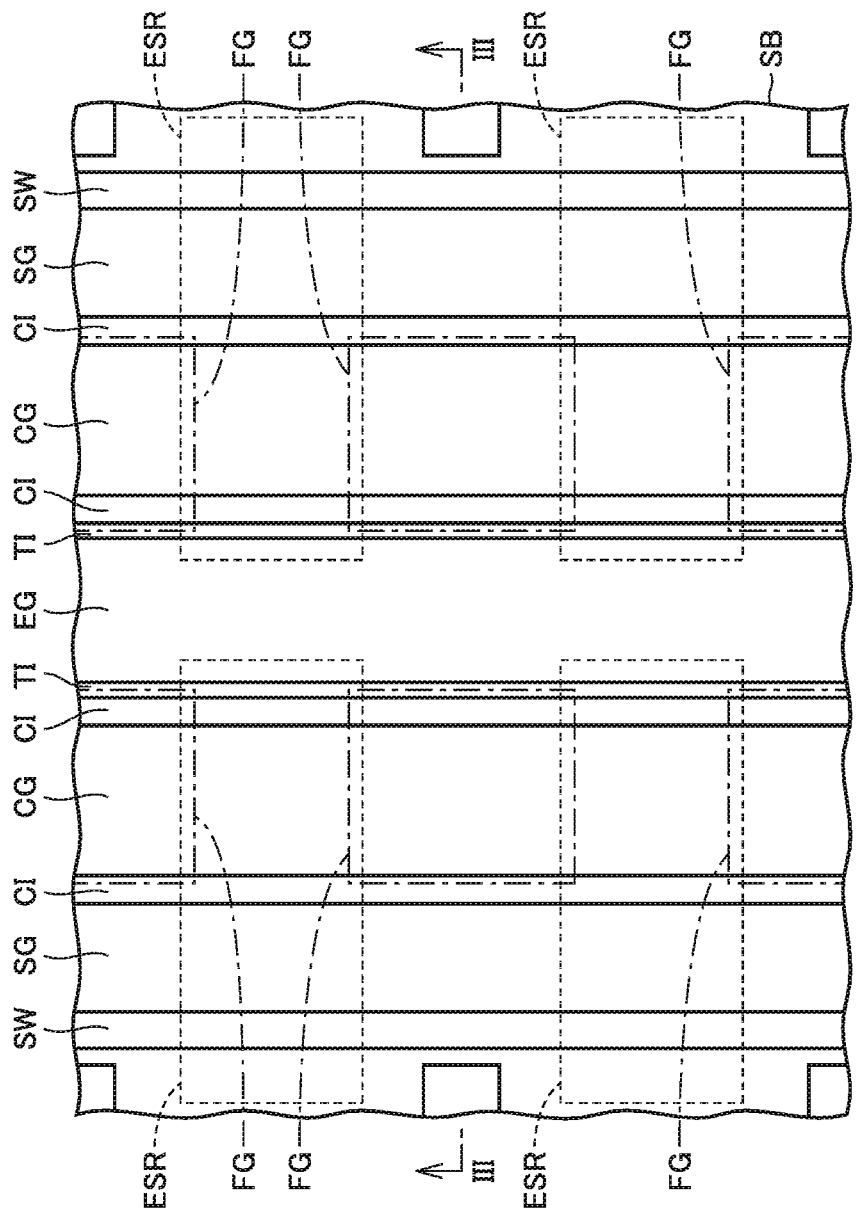
FIG. 2 is a plan view showing a portion in an enlarged manner of the configuration in a memory cell array of the semiconductor device shown in FIG. 1.

As mainly shown in FIG. 2, the nonvolatile flash memory cell of this embodiment is a split gate memory cell having a floating gate FG, a control gate CG, an erase gate EG and a select gate SG.

As seen in plan view, control gate CG, erase gate EG and select gate SG extend in juxtaposition with one another. As used herein, "seen in plan view" refers to a visual point from a direction orthogonal to the main surface of semiconductor substrate SB.

An insulating film CI is disposed between select gate SG and control gate CG. Select gate SG and control gate CG are electrically isolated from each other by insulating film CI. Insulating film CI and a tunnel insulating film TI are disposed between control gate CG and erase gate EG. Control gate CG and erase gate EG are electrically isolated from each other by insulating film CI and tunnel insulating film TI.

A sidewall insulating film SW is formed on a sidewall of select gate SG opposite to the side where control gate CG is disposed. This sidewall insulating film SW extends in juxtaposition and in contact with select gate SG.

A plurality of floating gates FG are disposed below one control gate CG. The plurality of floating gates FG disposed below one control gate CG are separated and electrically isolated from one another.

In addition, an element isolation insulating film ESR is formed on the main surface of semiconductor substrate SB. This element isolation insulating film ESR is an STI (Shallow Trench Isolation), for example. The STI has a trench formed in the main surface of semiconductor substrate SB, and a buried insulating film buried in the trench.

Figure 3:
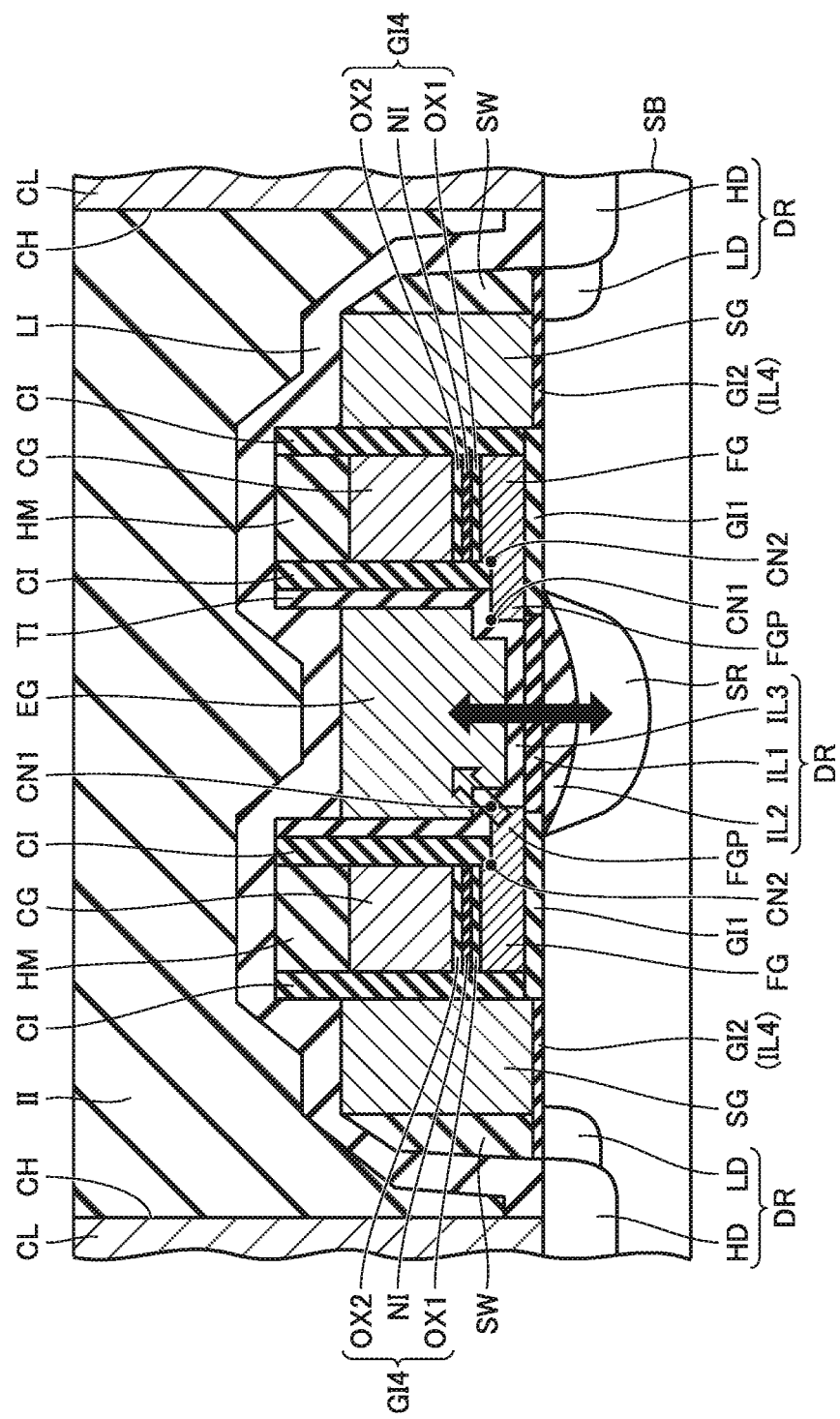
FIG. 3 is a schematic cross-sectional view along a line in FIG. 2.

As mainly shown in FIG. 3, semiconductor substrate SB has the main surface. The nonvolatile flash memory cell is formed on this main surface. This memory cell has, as described above, floating gate FG, control gate CG, erase gate EG, and select gate SG. This memory cell further has, in addition to the gates mentioned above, a drain region DR, a source region SR, gate insulating films GI1 to GI4, and tunnel insulating film TI.

Drain region DR is formed in the main surface of semiconductor substrate SB. Drain region DR has a low-concentration impurity region LD and a high-concentration impurity region HD. Low-concentration impurity region LD and high-concentration impurity region HD are in contact with each other. Drain region DR thus has an LDD (Lightly Doped Drain) structure.

Source region SR is formed in the main surface of semiconductor substrate SB at a distance from drain region DR. Floating gate FG and select gate SG are disposed on the main surface of semiconductor substrate SB lying between drain region DR and source region SR.

Gate insulating film GI1 (first gate insulating portion) is formed between floating gate FG and the main surface of semiconductor substrate SB. That is, gate insulating film GI1 is formed on the main surface of semiconductor substrate SB, and floating gate FG is formed on gate insulating film GI1. Gate insulating film GI1 is made of silicon oxide, for example.

Gate insulating film GI2 (IL4) (third gate insulating portion) is formed between select gate SG and the main surface of semiconductor substrate SB. That is, gate insulating film GI2 is formed on the main surface of semiconductor substrate SB, and select gate SG is formed on gate insulating film GI2. Gate insulating film GI2 is made of silicon oxide, for example.

Control gate CG is formed on floating gate FG with gate insulating film GI4 interposed therebetween. Gate insulating film GI4 has a stacked structure of, for example, a silicon oxide film OX1, a silicon nitride film NI, and a silicon oxide film OX2. A hard mask layer HM is formed on control gate CG.

Floating gate FG has a lateral protrusion FGP protruding laterally from a region immediately below control gate CG toward source region SR. Lateral protrusion FGP has a convex corner portion CN1 at an upper end closer to source region SR. Lateral protrusion FGP also has a concave corner portion CN2 at an upper end of the base portion located immediately below control gate CG.

Floating gate FG, gate insulating film GI4, control gate CG and hard mask layer HM form a gate stack structure. Insulating film CI is disposed between this gate stack structure and select gate SG. Floating gate FG and control gate CG of the gate stack structure are electrically isolated from select gate SG by insulating film CI.

Insulating film CI and tunnel insulating film TI are disposed between the above gate stack structure and erase gate EG. Floating gate FG and control gate CG of the gate stack structure are electrically isolated from erase gate EG by insulating film CI and tunnel insulating film TI.

Each of insulating films CI located on opposite sides of the above gate stack structure has a two-layer structure of, for example, a silicon oxide film and a silicon nitride film. The silicon oxide film forming insulating film CI is located closer to the gate stack structure, and the silicon nitride film is located farther from the gate stack structure.

Erase gate EG is formed so as to face lateral protrusion FGP of floating gate FG with tunnel insulating film TI interposed therebetween. Specifically, erase gate EG is formed on an upper surface and a side surface of lateral protrusion FGP which form convex corner portion CN1, with tunnel insulating film TI interposed therebetween. Erase gate EG faces an upper surface and a side surface of floating gate FG which form convex corner portion CN1. Erase gate EG is formed on the main surface of semiconductor substrate SB. Gate insulating film GI3 (second gate insulating portion) is formed between semiconductor substrate SB and erase gate EG.

Gate insulating film GI3 has a portion made of a material different from that of gate insulating film GI1. Gate insulating film GI3 has an insulating film IL1, an insulating film IL2, and an insulating film IL3. Insulating film IL1 has the same thickness as, and is adjacent to, gate insulating film GI1. Insulating film IL1 extends to a region immediately below floating gate FG. Insulating film IL1 is made of a material different from that of gate insulating film GI1. When gate insulating film GI1 includes a portion made of silicon oxide, for example, insulating film IL1 is made of silicon oxynitride in which nitrogen has been introduced into silicon oxide, for example.

Insulating film IL2 is formed between insulating film IL1 and semiconductor substrate SB (source region SR). This insulating film IL2 has a convex shape bulging toward semiconductor substrate SB. Insulating film IL2 is made of a material different from that of insulating film IL1, and is made of silicon oxide, for example.

Insulating film IL3 is formed between insulating film IL1 and erase gate EG. Insulating film IL3 is part of tunnel insulating film TI. Insulating film IL3 (TI) is made of a material different from that of insulating film IL1, and is made of silicon oxide, for example.

Sidewall insulating film SW is formed across select gate SG from the gate stack structure. Sidewall insulating film SW is made of silicon oxide, for example. Low-concentration impurity region LD of drain region DR is located in a region immediately below this sidewall insulating film SW.

Each of floating gate FG, select gate SG, control gate CG and erase gate EG is made of polycrystalline silicon having an impurity introduced therein (hereinafter referred to as doped polysilicon), for example.

Two gate stack structures are disposed to sandwich therebetween one erase gate EG. Two select gates SG are disposed to sandwich therebetween an arrangement in which the gate stack structure, erase gate EG and the gate stack structure are juxtaposed to one another. Specifically, one of two select gates SG is disposed across one of the two gate stack structures from erase gate EG. The other of two select gates SG is disposed across the other of the two gate stack structures from erase gate EG.

Insulating film IL1 extends from one of two floating gates FG to the other of floating gates FG.

A liner insulating film LI is formed so as to cover the memory cells described above. An interlayer insulating film II is formed so as to cover this liner insulating film LI. A contact hole CH is formed in interlayer insulating film II and liner insulating film LI. Contact hole CH penetrates interlayer insulating film II and liner insulating film LI and reaches high-concentration impurity region HD of drain region DR. A conducting film CL is buried in this contact hole CH. A wiring layer (not shown) is formed on interlayer insulating film II, and is electrically connected to drain region DR through conducting film CL.

Next, a method of manufacturing the semiconductor device of this embodiment is described with reference to FIGS. 4 to 22.

Figure 4:
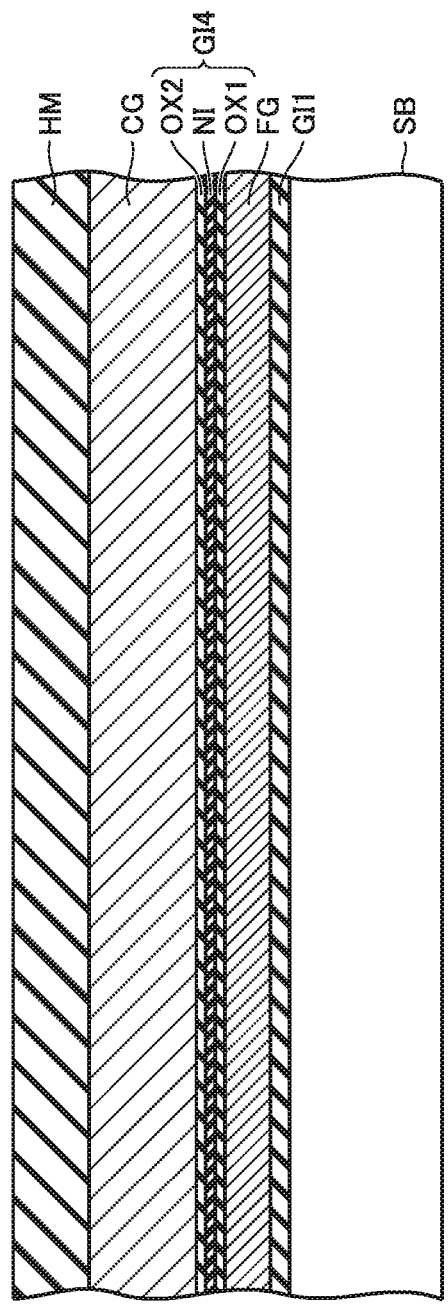
FIG. 4 is a cross-sectional view schematically showing a first step of a method of manufacturing the semiconductor device in the first embodiment.

As shown in FIG. 4, semiconductor substrate SB having the main surface is prepared. Gate insulating film GI1 made of silicon oxide is formed by a thermal oxidation process, for example, on the main surface of semiconductor substrate SB. A conducting film FG for floating gate made of doped polysilicon, for example, is formed on this gate insulating film GI1. Conducting film FG for floating gate is patterned by a photolithography process and an etching process.

Then, gate insulating film GI4 having a three-layer structure of silicon oxide film OX1, silicon nitride film NI and silicon oxide film OX2, for example, is formed on conducting film FG for floating gate. A conducting film CG for control gate made of doped polysilicon, for example, is formed on conducting film FG for floating gate, with this gate insulating film GI4 interposed therebetween. Hard mask layer HM made of silicon nitride, for example, is formed on this conducting film CG for control gate.

Figure 5:
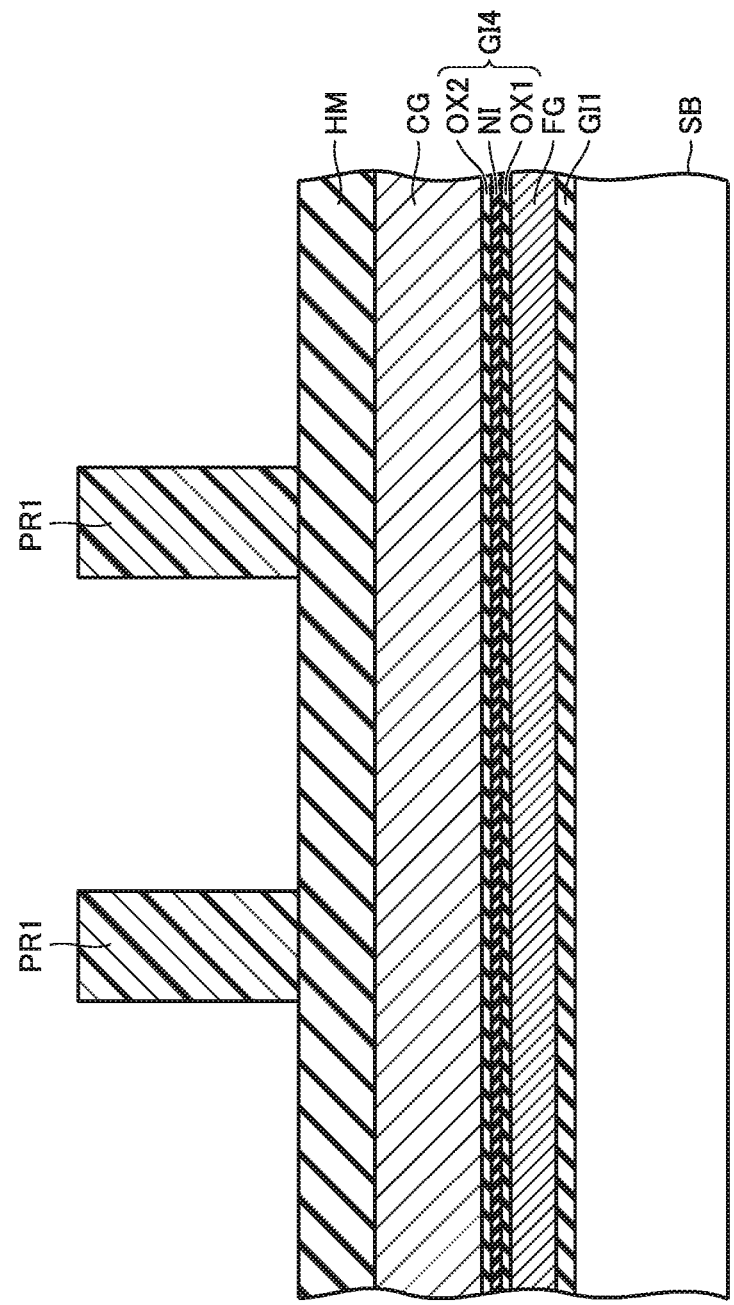
FIG. 5 is a cross-sectional view schematically showing a second step of the method of manufacturing the semiconductor device in the first embodiment.

As shown in FIG. 5, a photoresist PR1 is applied onto hard mask layer HM. This photoresist PR1 is patterned by exposure, development and the like. Hard mask layer HM is patterned with patterned photoresist PR1 as a mask. Then, photoresist PR1 is removed by acid stripping, ashing and the like, for example.

Figure 6:
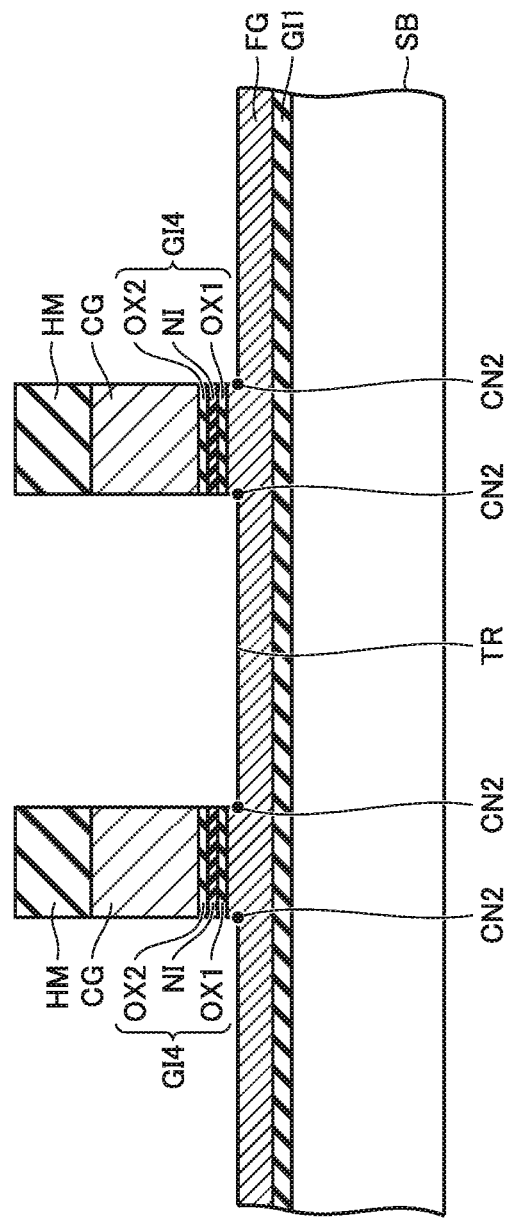
FIG. 6 is a cross-sectional view schematically showing a third step of the method of manufacturing the semiconductor device in the first embodiment.

As shown in FIG. 6, conducting film CG for control gate and gate insulating film GI4 are patterned with patterned hard mask layer HM as a mask. Further, a prescribed amount of an upper surface of conducting film FG for floating gate is removed. As a result, a trench portion TR is formed on the upper surface of conducting film FG for floating gate. Concave corner portion CN2 is formed at an end portion of trench portion TR.

Figure 7:
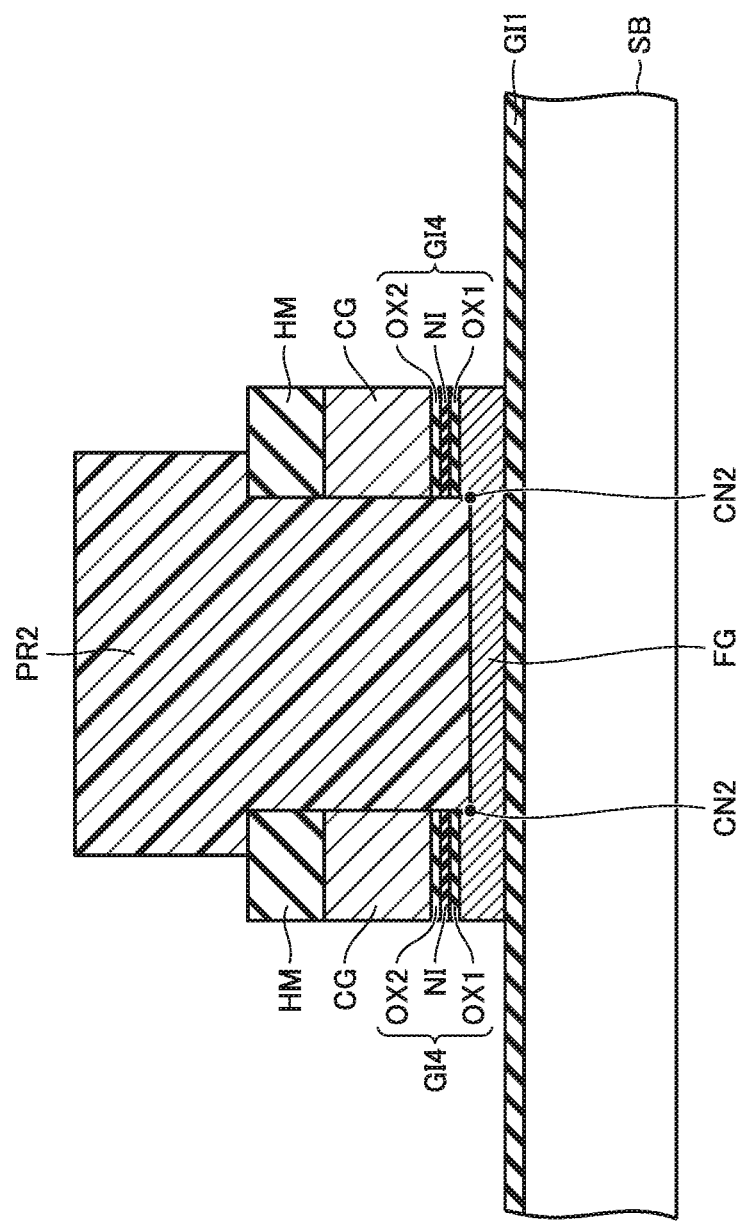
FIG. 7 is a cross-sectional view schematically showing a fourth step of the method of manufacturing the semiconductor device in the first embodiment.

As shown in FIG. 7, a photoresist PR2 is applied onto semiconductor substrate SB. This photoresist PR2 is patterned by exposure, development and the like. Exposed conducting film FG for floating gate is removed with patterned photoresist PR2 and hard mask layer HM as a mask. Then, photoresist PR2 is removed by acid stripping, ashing and the like, for example.

Figure 8:
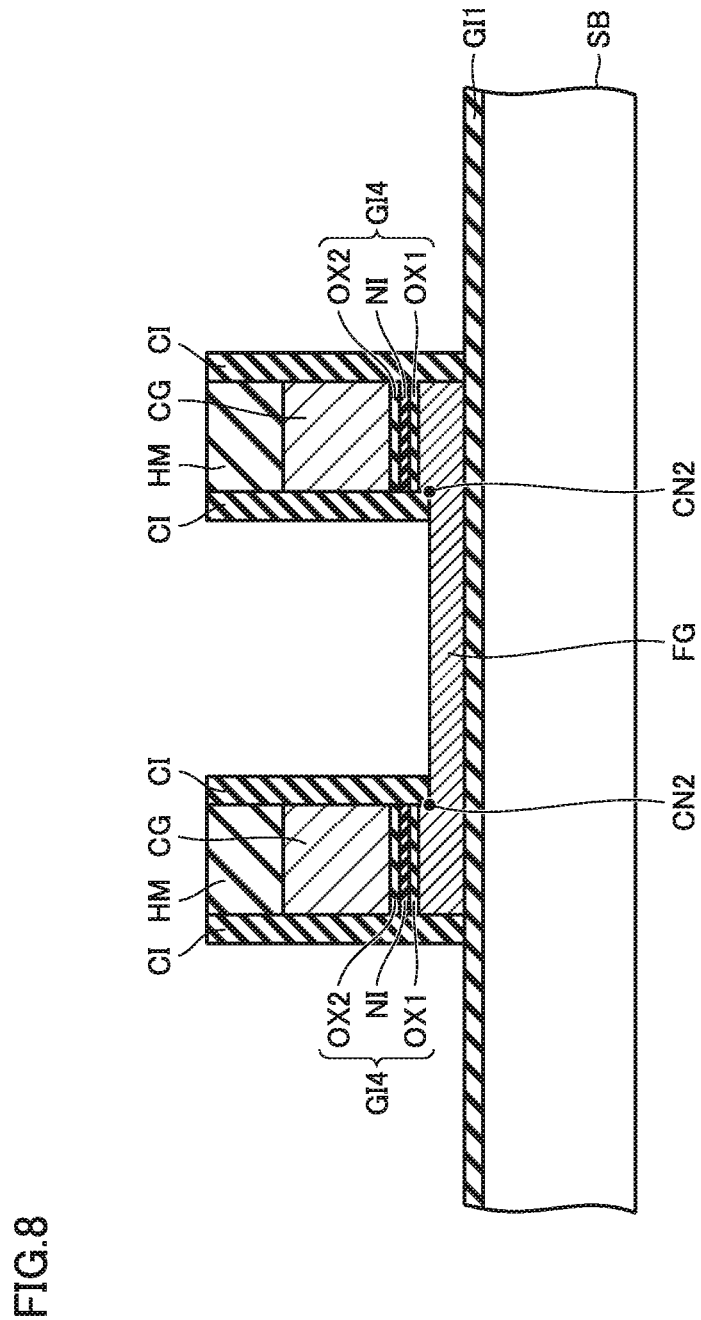
FIG. 8 is a cross-sectional view schematically showing a fifth step of the method of manufacturing the semiconductor device in the first embodiment.

As shown in FIG. 8, insulating film CI is formed so as to cover gate insulating film GI1 and hard mask layer HM. This insulating film CI is formed of a silicon oxide film and a silicon nitride film thereon, for example.

Anisotropic etching is performed on the entire surface of this insulating film CI until the upper surface of each of hard mask layer HM and gate insulating film GI1 is exposed. As a result of this etching, insulating film CI remains only on the sidewalls of hard mask layer HM, control gate CG and the like.

Figure 9:
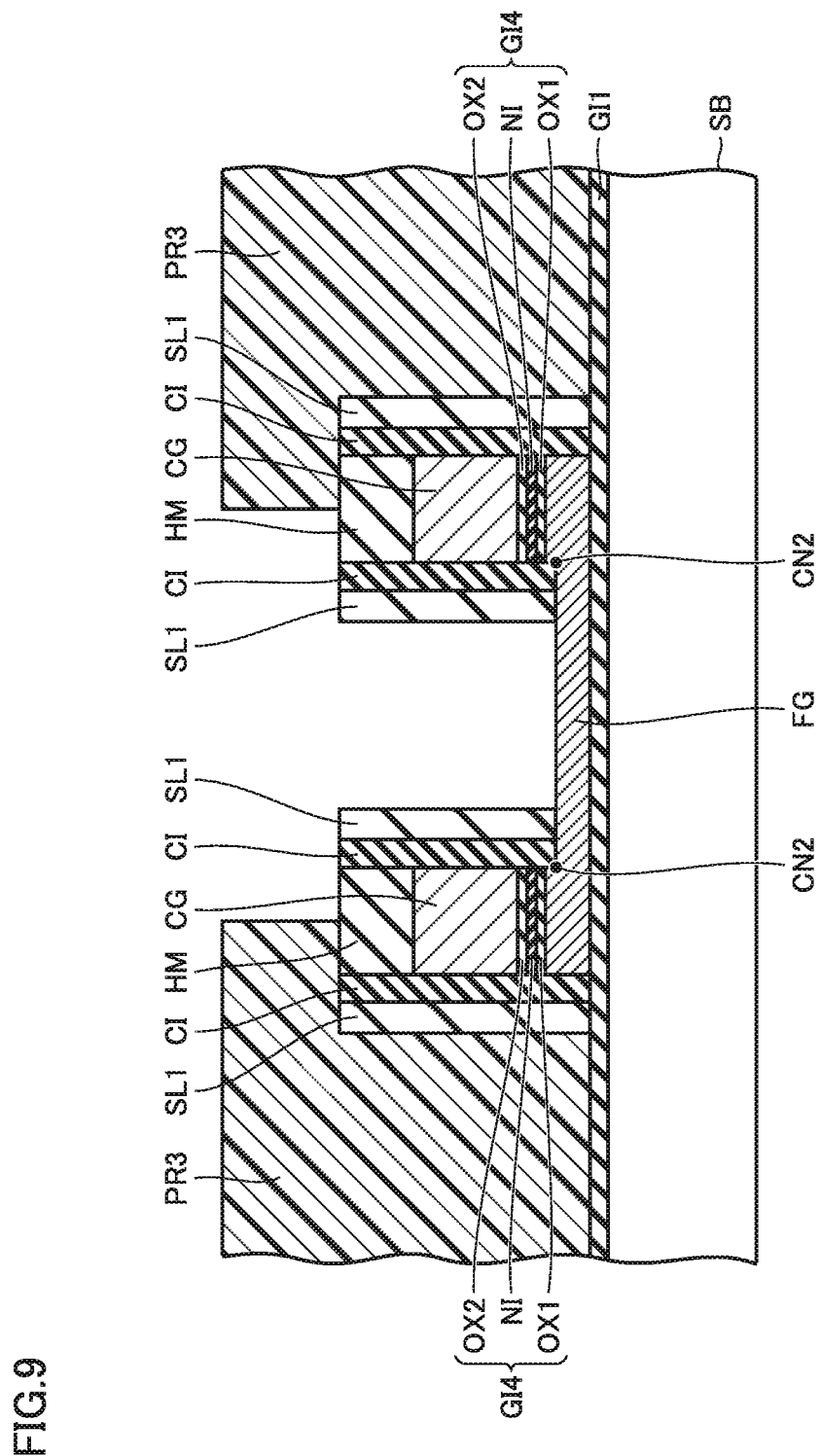
FIG. 9 is a cross-sectional view schematically showing a sixth step of the method of manufacturing the semiconductor device in the first embodiment.

As shown in FIG. 9, an insulating film SL1 is formed so as to cover gate insulating film GI1, hard mask layer HM and insulating film CI. This insulating film SL1 is formed such that it is made of the same material as that of gate insulating film GI1, and is made of silicon oxide, for example. Anisotropic etching is performed on the entire surface of this insulating film SL1 until the upper surface of each of hard mask layer HM and gate insulating film GI1 is exposed. As a result of this etching, insulating film SL1 (first sidewall insulating film) remains only on a sidewall of insulating film CI. Remaining insulating film SL1 covers one of the sidewalls of control gate CG over floating gate FG, with insulating film CI interposed therebetween.

A photoresist PR3 is applied onto semiconductor substrate SB. This photoresist PR3 is patterned by exposure, development and the like. Exposed conducting film FG for floating gate is selectively removed with patterned photoresist PR3, hard mask layer HM and insulating films CI, SL1 as a mask.

Figure 10:
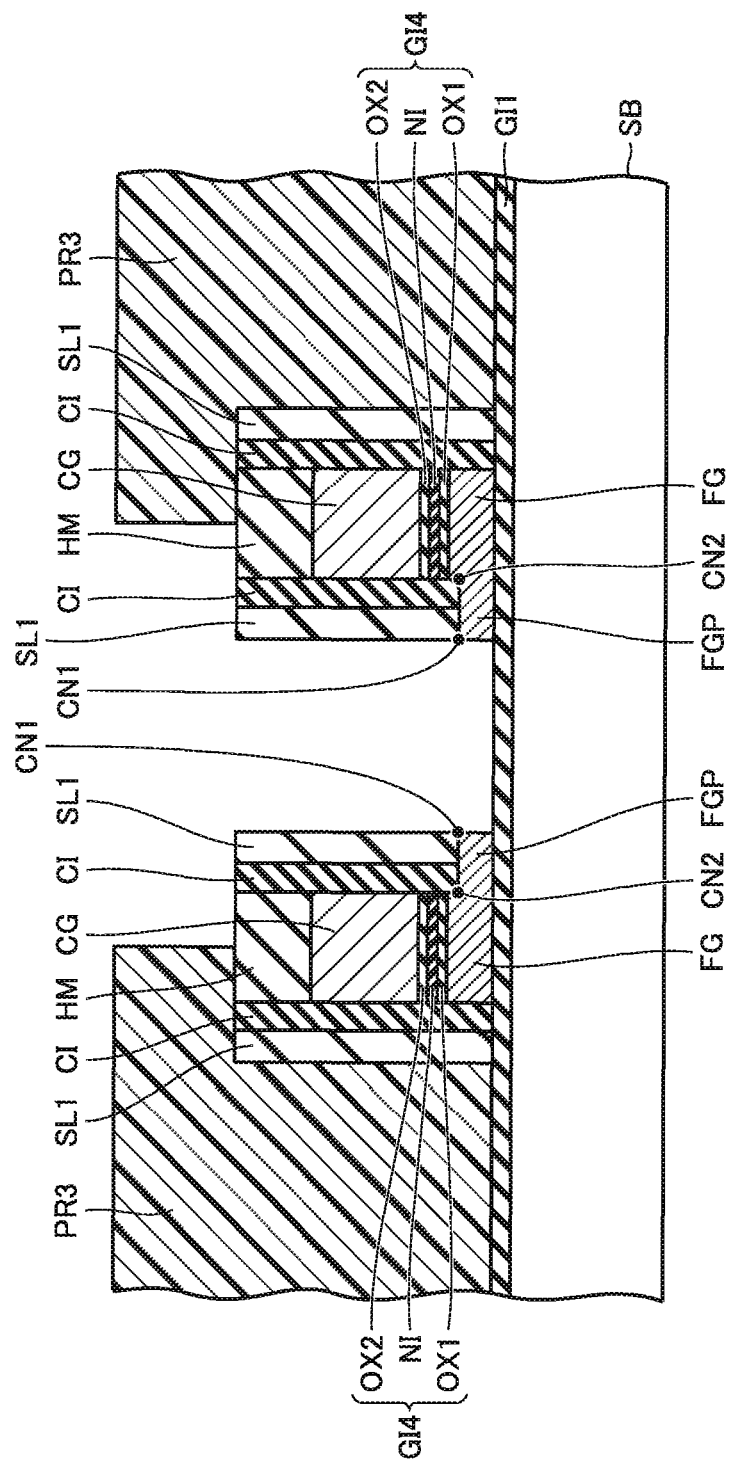
FIG. 10 is a cross-sectional view schematically showing a seventh step of the method of manufacturing the semiconductor device in the first embodiment.

As shown in FIG. 10, as a result of the selective removal of conducting film FG for floating gate described above, floating gate FG is formed from conducting film FG for floating gate. The gate stack structure of floating gate FG, gate insulating film GI4, control gate CG and hard mask layer HM is thus formed. In addition, as a result of the removal of conducting film FG for floating gate described above, gate insulating film GI1 is partially exposed at floating gate FG.

As a result, floating gate FG is formed with lateral protrusion FGP protruding laterally from the region immediately below control gate CG. The upper end of this lateral protrusion FGP has convex corner portion CN1.

Figure 11:
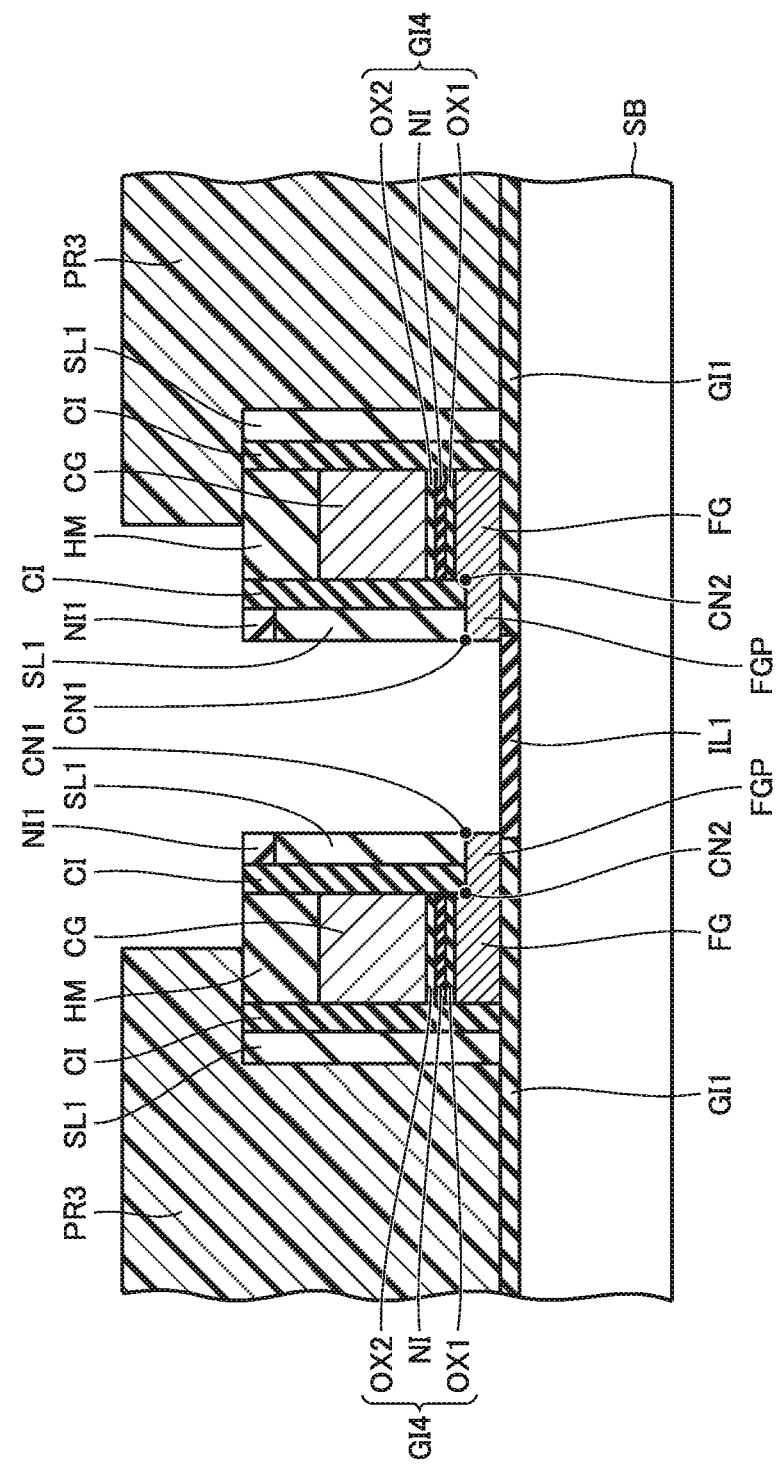
FIG. 11 is a cross-sectional view schematically showing an eighth step of the method of manufacturing the semiconductor device in the first embodiment.

As shown in FIG. 11, nitrogen is introduced into the exposed portion of gate insulating film GI1. A nitrogen introduced portion IL1 (first nitrogen introduced portion) is thus formed at the exposed portion of gate insulating film GI1. A material for this nitrogen introduced portion IL1 is silicon oxynitride, for example.

As the conditions for the nitrogen introduction, an average projection range Rp is between 8 nm and 30 nm, and implantation energy is between 1 keV and 5 keV, for example. Under these conditions, a sufficient amount of nitrogen is introduced into a silicon oxide film having a thickness of about between 10 nm and 20 nm, for example.

In addition, as the conditions for the nitrogen implantation described above, an implantation angle is 0 degree, and a dose amount is between $1 \times 10^{15}$ atoms/cm$^2$ and $5 \times 10^{15}$ atoms/cm$^2$, for example. The above implantation angle allows the implantation of nitrogen to a deep position. The above dose amount allows an etching rate of nitrogen introduced portion IL1 to be sufficiently slow with respect to a hydrofluoric acid (HF) solution used in a later step.

It is noted that during this nitrogen introduction, nitrogen is also introduced into the upper surface of insulating film SL1 to form a nitrogen introduced portion NI1. A material for this nitrogen introduced portion NI1 is also silicon oxynitride, for example.

Then, photoresist PR3 is removed by acid stripping, ashing and the like, for example. If photoresist PR3 is removed by acid stripping, for example, megasonic cleaning can be applied. Cleaning is then performed. Megasonic cleaning can be applied to this cleaning as well.

Figure 12:
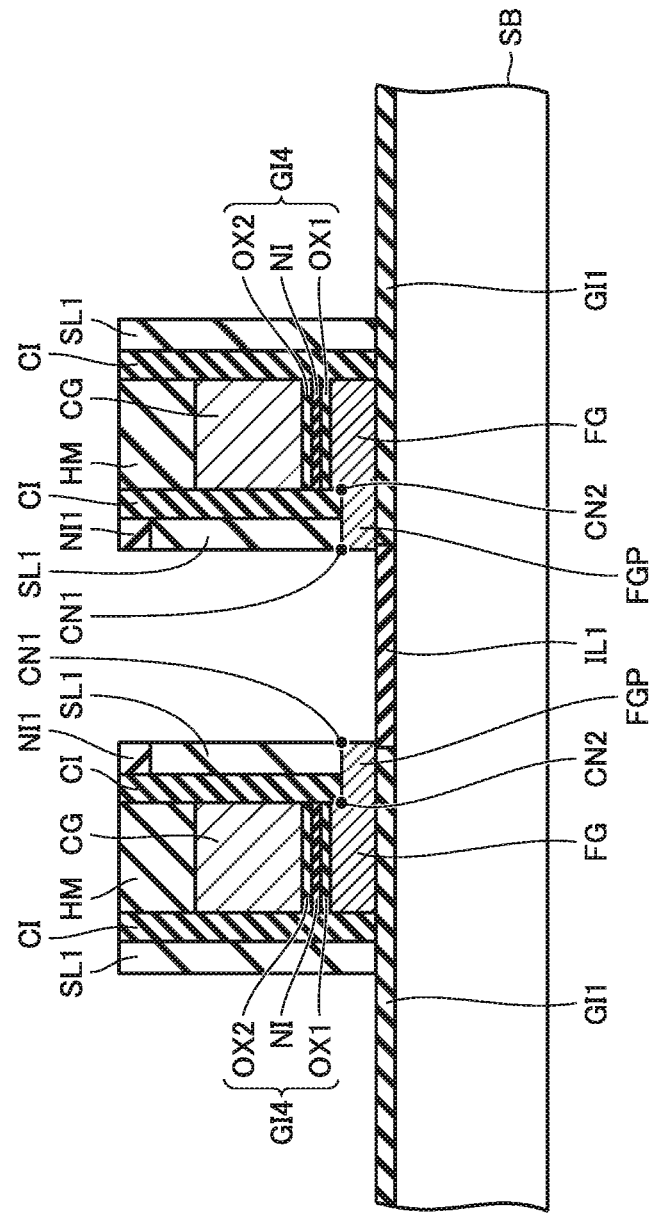
FIG. 12 is a cross-sectional view schematically showing a ninth step of the method of manufacturing the semiconductor device in the first embodiment.

As shown in FIG. 12, as a result of the removal of photoresist PR3 described above, the upper surface of gate insulating film GI1, the upper surface of hard mask layer HM and the like are exposed. Annealing is then performed. This annealing takes place so as to form silicon oxynitride of thermally strong bonding in nitrogen introduced portion IL1.

The above annealing is performed in a nitrogen atmosphere, for example, at a temperature of between 950° C. and 1050° C. for a period of between 10 seconds and 60 seconds. Nitrogen introduced portion IL1 is formed to slightly dig into the region immediately below floating gate FG.

Then, insulating film SL1 and gate insulating film GI1 exposed at the gate stack structure are removed by wet etching using a chemical solution of hydrofluoric acid. During this etching, nitrogen introduced portion NI1 formed on the upper surface of insulating film SL1 is also simultaneously removed.

Figure 13:
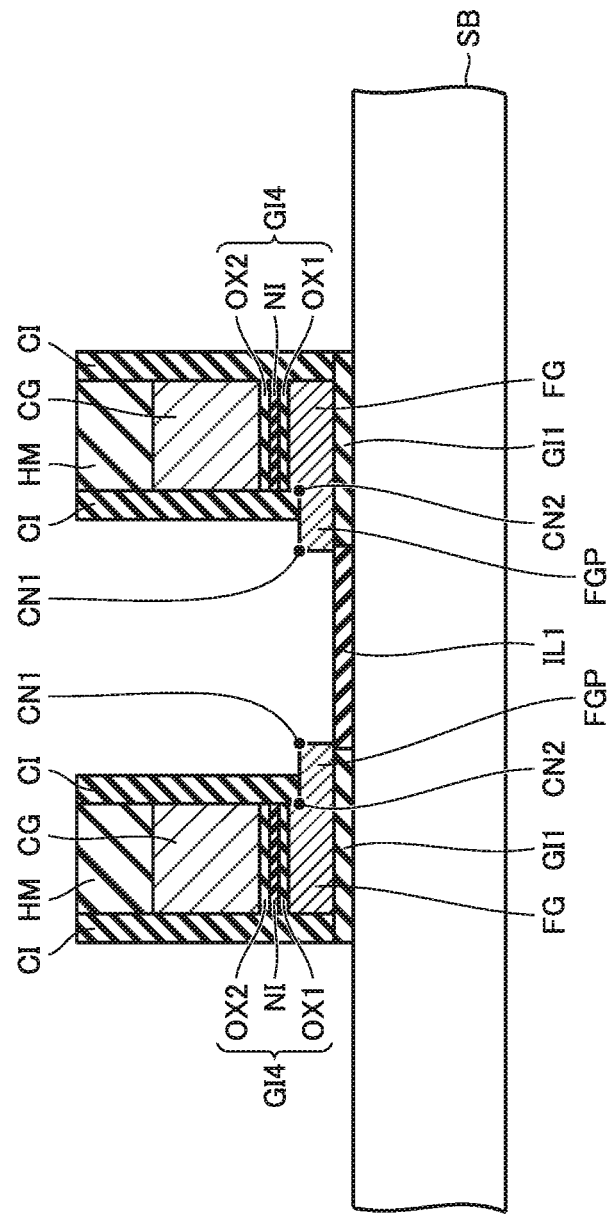
FIG. 13 is a cross-sectional view schematically showing a tenth step of the method of manufacturing the semiconductor device in the first embodiment.

As shown in FIG. 13, as a result of the above wet etching, the upper surface of lateral protrusion FGP of floating gate FG and convex corner portion CN1 are exposed. Acid cleaning is performed in this state. Megasonic cleaning can be applied to this acid cleaning.

Figure 14:
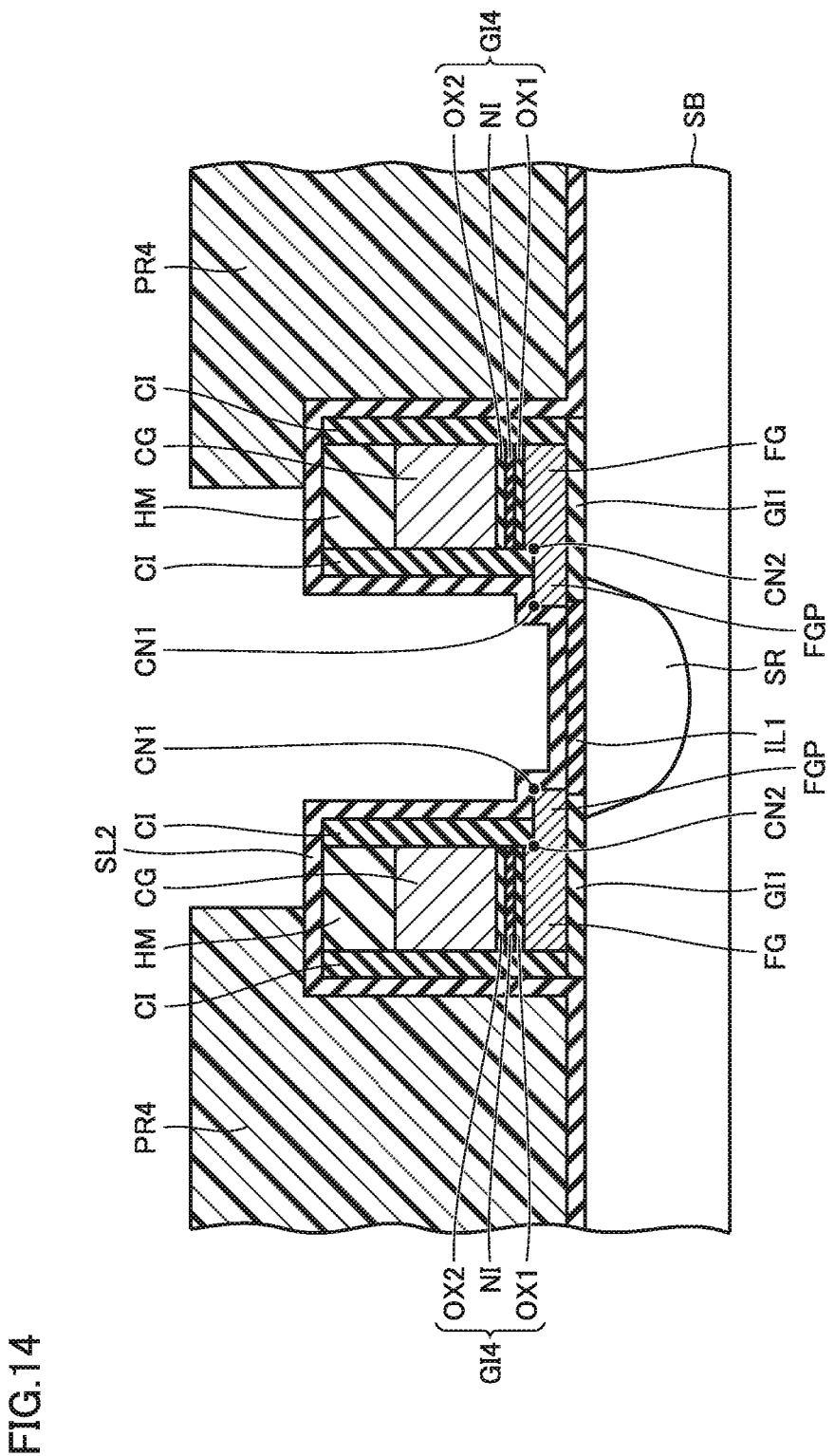
FIG. 14 is a cross-sectional view schematically showing an eleventh step of the method of manufacturing the semiconductor device in the first embodiment.

As shown in FIG. 14, an insulating film SL2 is formed on the main surface of semiconductor substrate SB so as to cover the gate stack structure (which includes floating gate FG and control gate CG) and nitrogen introduced portion IL1. Then, a photoresist PR4 is applied onto insulating film SL2. This photoresist PR4 is patterned by exposure, development and the like.

Impurity (for example, arsenic) ions are implanted into the main surface of semiconductor substrate SB with this photoresist PR4 as a mask. Source region SR is thus formed in the main surface of semiconductor substrate SB.

Then, photoresist PR4 is removed by acid stripping, ashing and the like, for example. If photoresist PR4 is removed by acid stripping, for example, megasonic cleaning can be applied.

Figure 15:
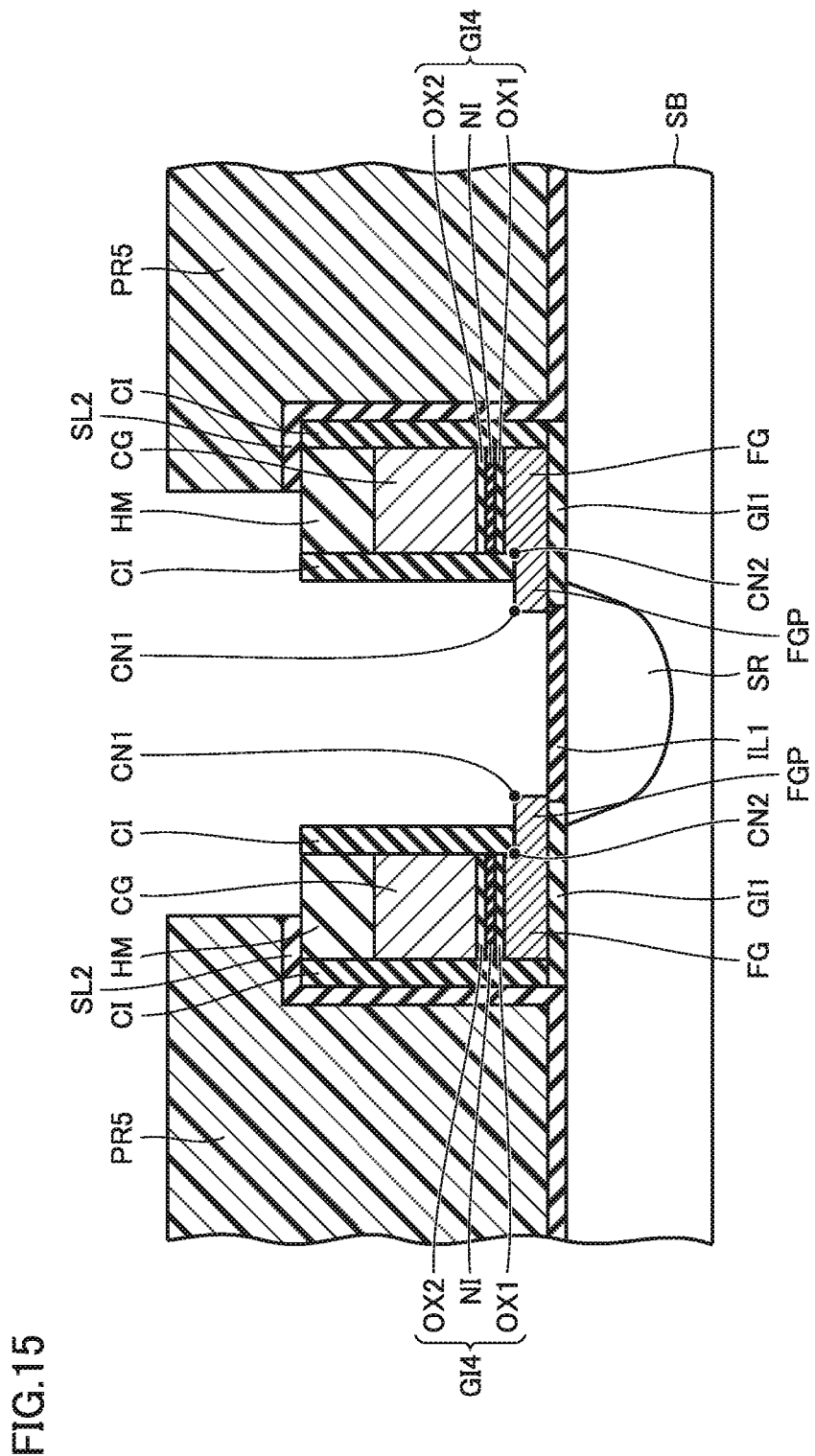
FIG. 15 is a cross-sectional view schematically showing a twelfth step of the method of manufacturing the semiconductor device in the first embodiment.

As shown in FIG. 15, a photoresist PR5 is applied onto insulating film SL2. This photoresist PR5 is patterned by exposure, development and the like. Insulating film SL2 is removed by etching with patterned photoresist PR5 as a mask. The portion of insulating film SL2 exposed at photoresist PR5 is thus removed, exposing hard mask layer HM, insulating film CI, lateral protrusion FGP of the floating gate, and nitrogen introduced portion IL1.

Then, photoresist PR5 is removed by acid stripping, ashing and the like, for example. If photoresist PR5 is removed by acid stripping, for example, megasonic cleaning can be applied.

Figure 16:
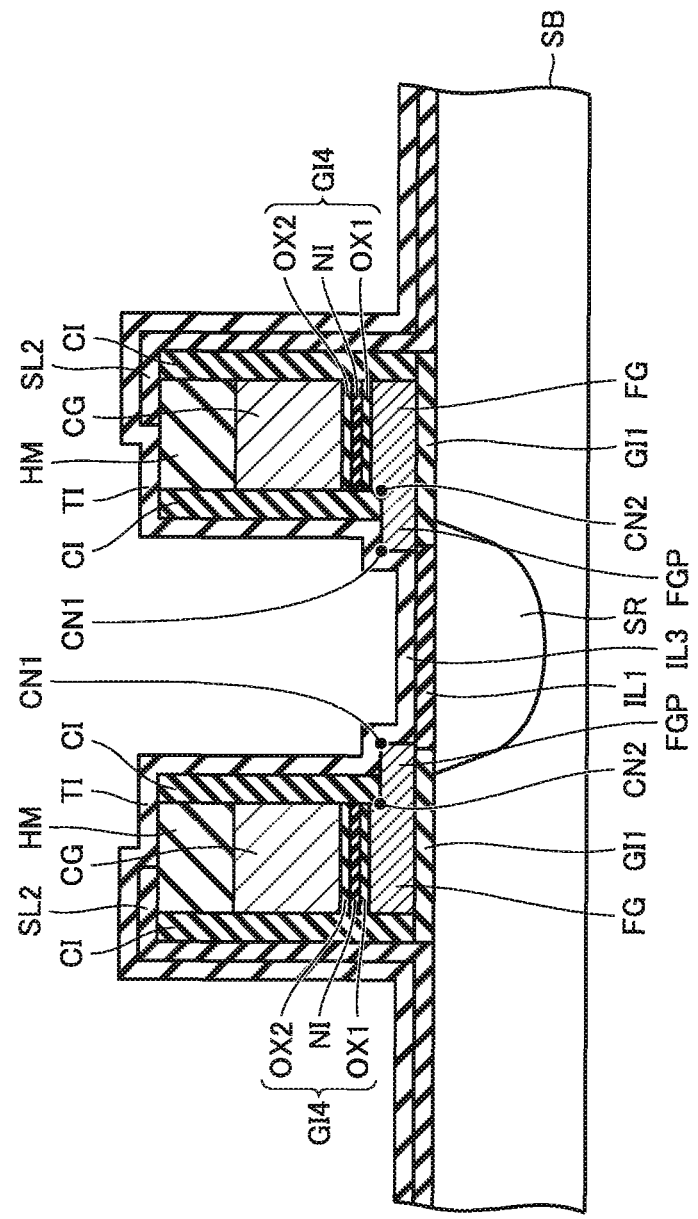
FIG. 16 is a cross-sectional view schematically showing a thirteenth step of the method of manufacturing the semiconductor device in the first embodiment.

As shown in FIG. 16, after photoresist PR5 is removed, acid cleaning is performed. Megasonic cleaning can be applied to this acid cleaning. Then, annealing is performed for activating the impurity that has been introduced into source region SR.

After the above annealing, acid cleaning is performed. Megasonic cleaning can be applied to this acid cleaning. Then, tunnel insulating film TI is formed so as to cover the gate stack structure. This tunnel insulating film TI is formed so as to cover convex corner portion CN1 of lateral protrusion FGP of the floating gate. Annealing is then performed.

Figure 17:
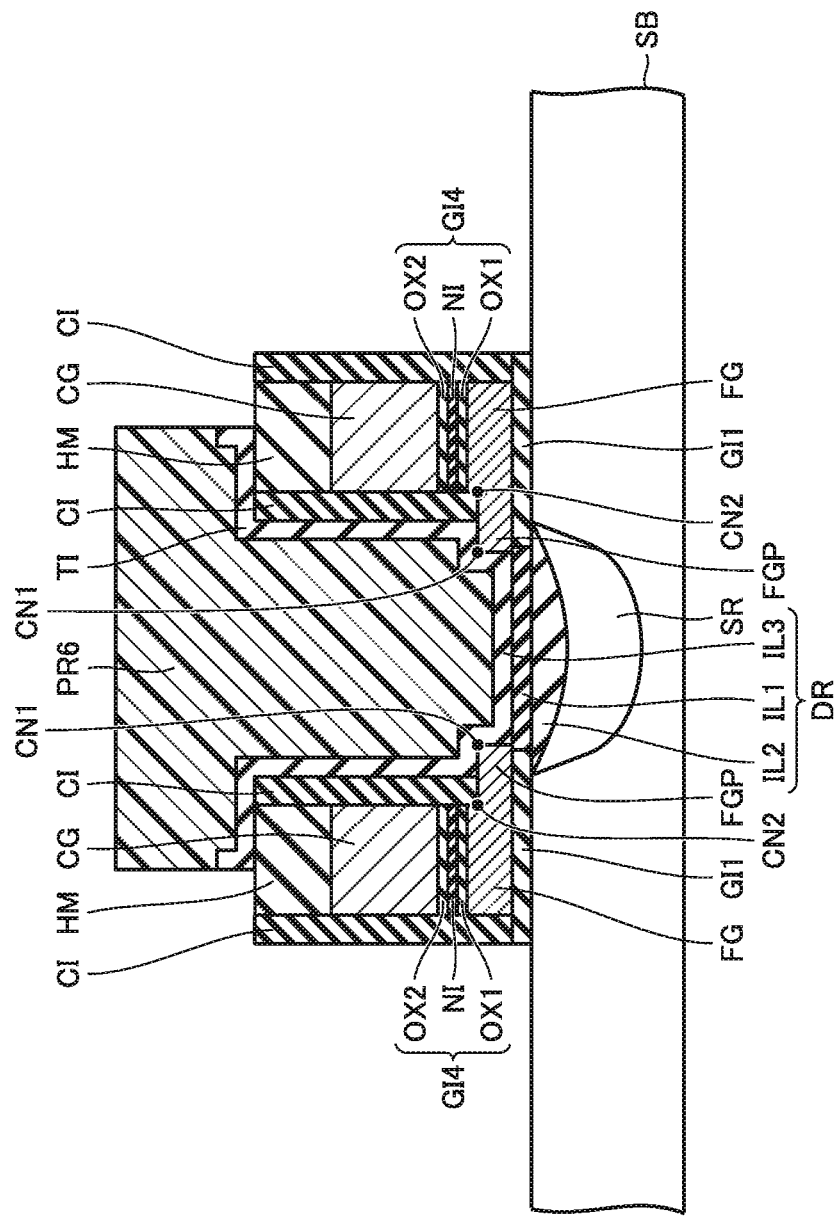
FIG. 17 is a cross-sectional view schematically showing a fourteenth step of the method of manufacturing the semiconductor device in the first embodiment.

As shown in FIG. 17, as a result of the above annealing, semiconductor substrate SB is oxidized below insulating film IL1. Insulating film IL2 made of silicon oxide, for example, is thus formed between insulating film IL1 and semiconductor substrate SB. In addition, as a result of the above annealing, the thickness of tunnel insulating film TI located immediately above insulating film IL1 increases.

Then, a photoresist PR6 is applied onto tunnel insulating film TI. This photoresist PR6 is patterned by exposure, development and the like. Tunnel insulating film TI and insulating film SL2 are removed by etching with patterned photoresist PR6 as a mask. Hard mask layer HM, insulating film CI, and the main surface of semiconductor substrate SB are thus exposed.

Then, photoresist PR6 is removed by acid stripping, ashing and the like, for example. If photoresist PR6 is removed by acid stripping, for example, megasonic cleaning can be applied.

Figure 18:
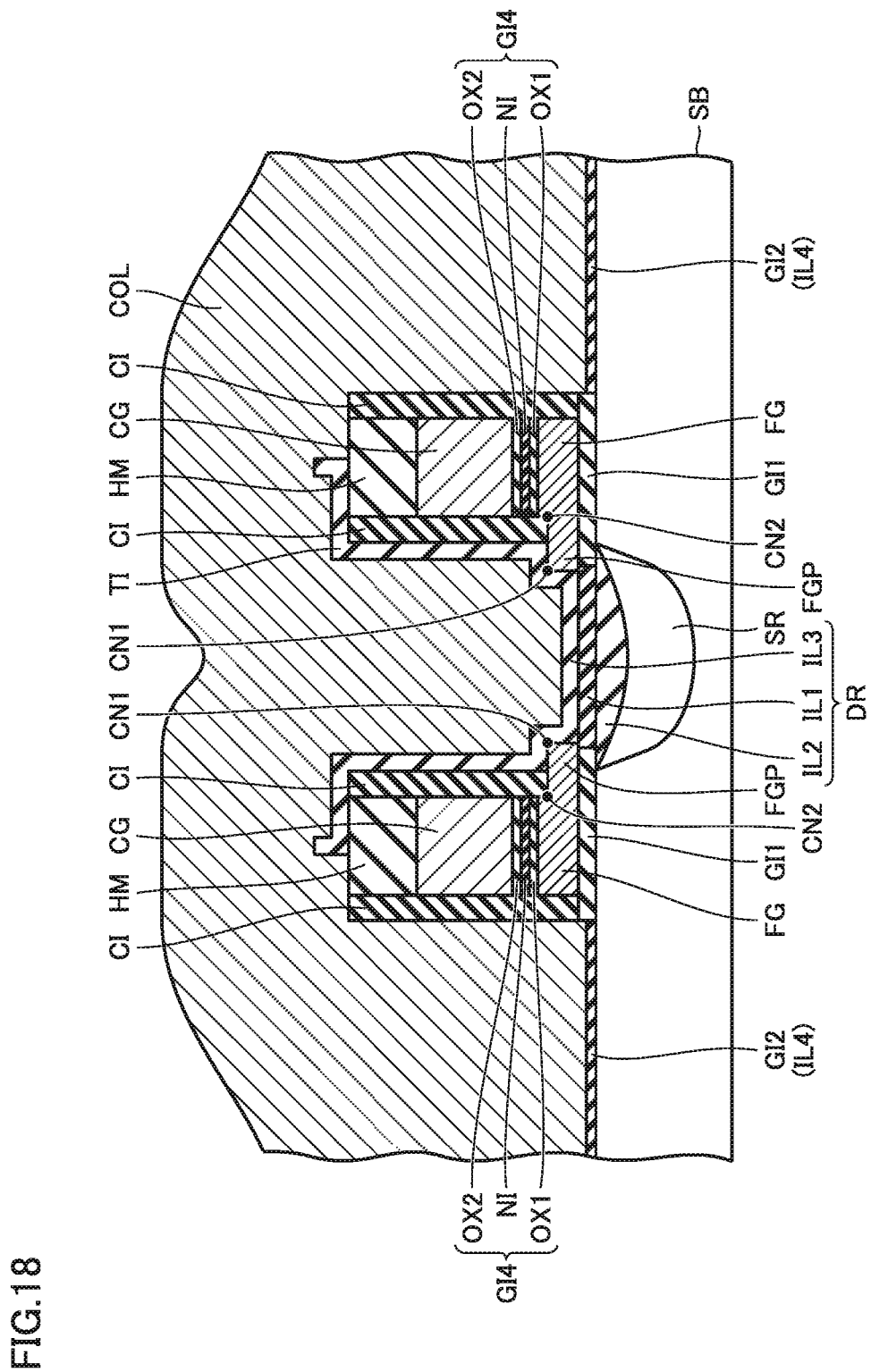
FIG. 18 is a cross-sectional view schematically showing a fifteenth step of the method of manufacturing the semiconductor device in the first embodiment.

As shown in FIG. 18, after photoresist PR6 is removed, acid cleaning is performed. Megasonic cleaning can be applied to this acid cleaning. Then, gate insulating film GI2 made of silicon oxide, for example, is formed on the main surface of semiconductor substrate SB. Then, a conducting film COL made of doped polysilicon, for example, is formed so as to cover the entire surface. This conducting film COL is etched back.

Figure 19:
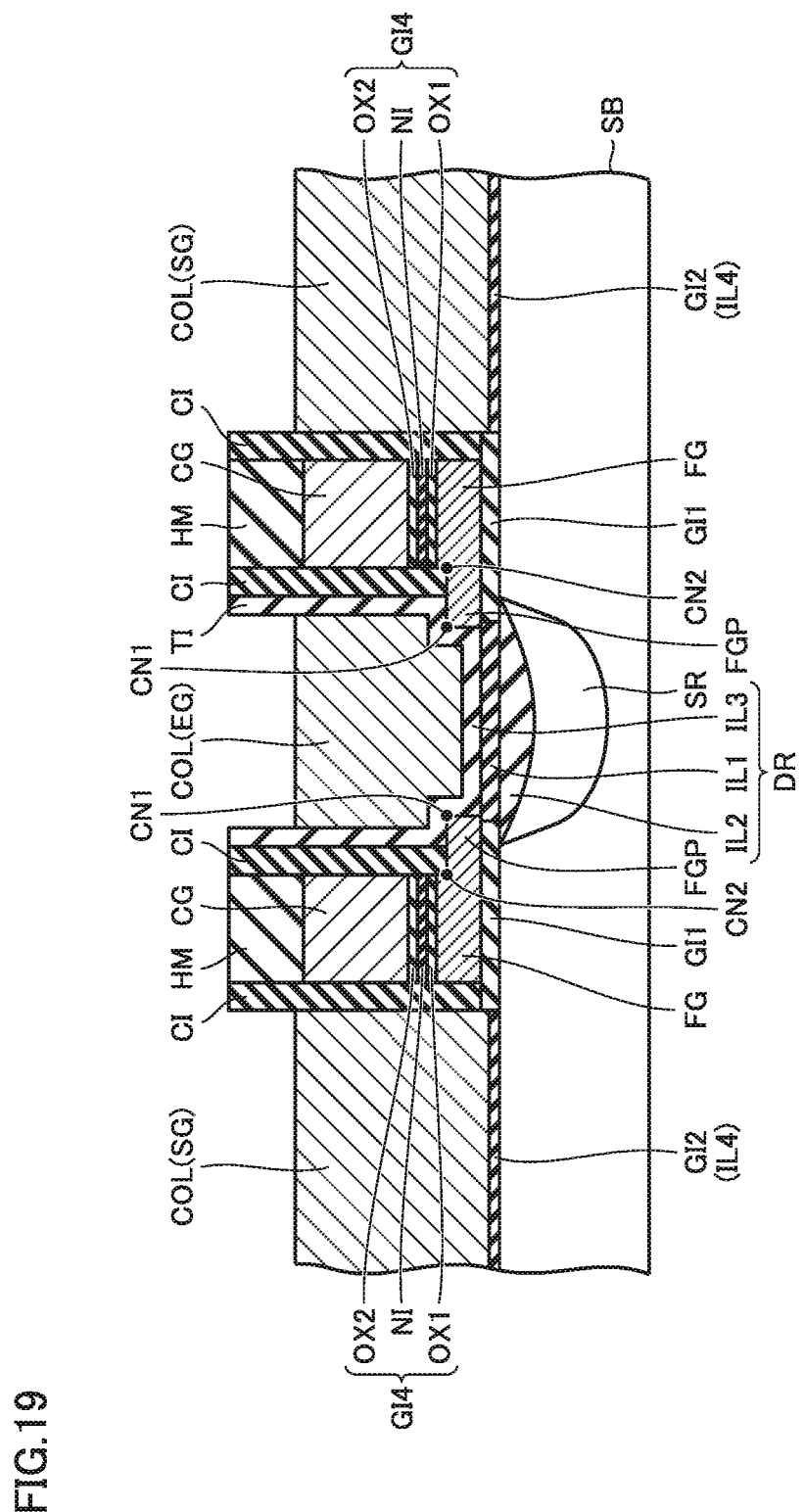
FIG. 19 is a cross-sectional view schematically showing a sixteenth step of the method of manufacturing the semiconductor device in the first embodiment.

As shown in FIG. 19, as a result of the above etchback, the upper surface of conducting film COL is located lower than the upper surface of the gate stack structure (the upper surface of hard mask layer HM). Erase gate EG and select gate SG are thus formed from conducting film COL. Erase gate EG is formed so as to face the upper surface and the side surface of lateral protrusion FGP of floating gate FG, with tunnel insulating film TI interposed therebetween. Select gate SG is formed across floating gate FG from erase gate EG.

Figure 20:
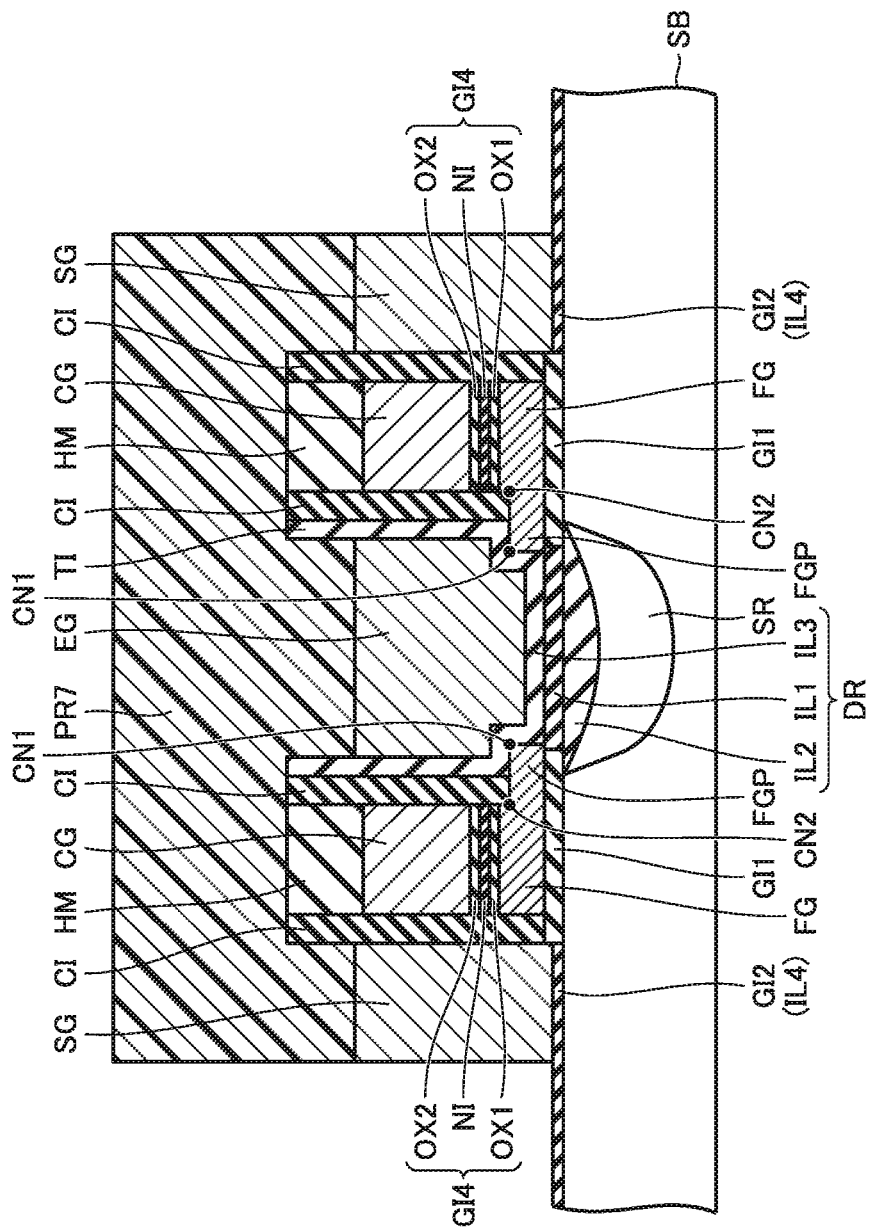
FIG. 20 is a cross-sectional view schematically showing a seventeenth step of the method of manufacturing the semiconductor device in the first embodiment.

As shown in FIG. 20, a photoresist PR7 is applied. This photoresist PR7 is patterned by exposure, development and the like. Select gate SG is partially removed by etching with patterned photoresist PR6 as a mask. Then, photoresist PR6 is removed by acid stripping, ashing and the like, for example.

Figure 21:
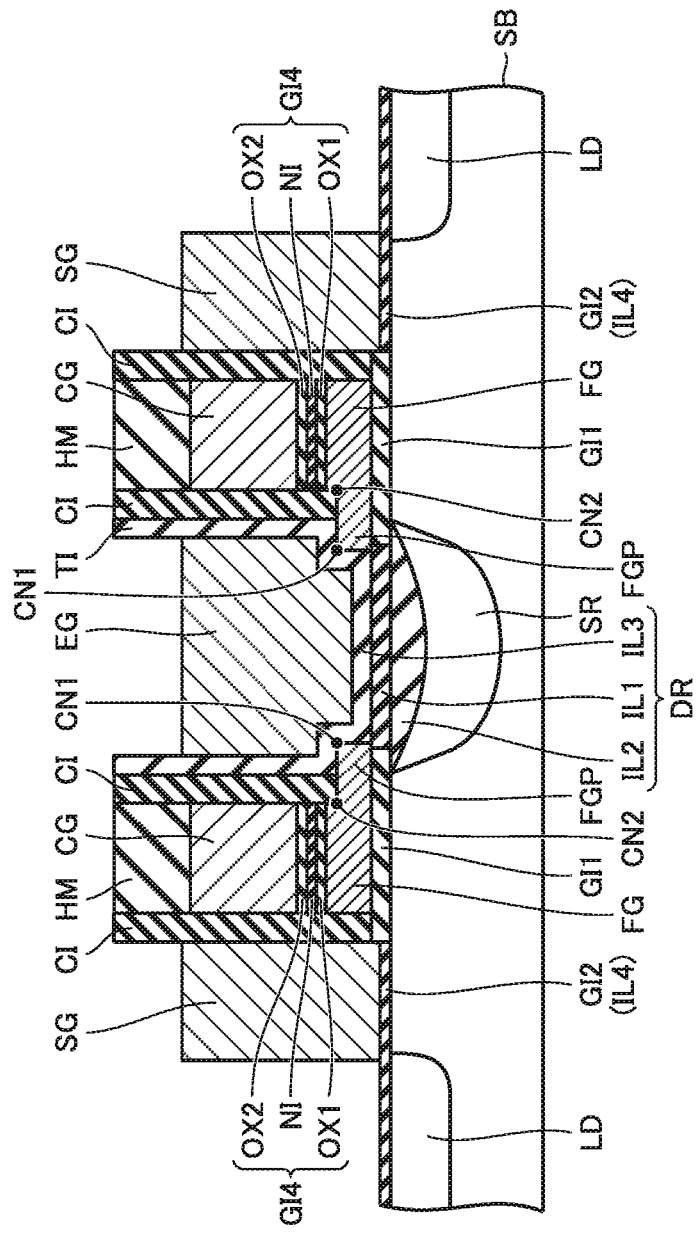
FIG. 21 is a cross-sectional view schematically showing an eighteenth step of the method of manufacturing the semiconductor device in the first embodiment.

As shown in FIG. 21, impurity ions are implanted into the main surface of semiconductor substrate SB. Low-concentration impurity region LD is thus formed in the main surface of semiconductor substrate SB.

Figure 22:
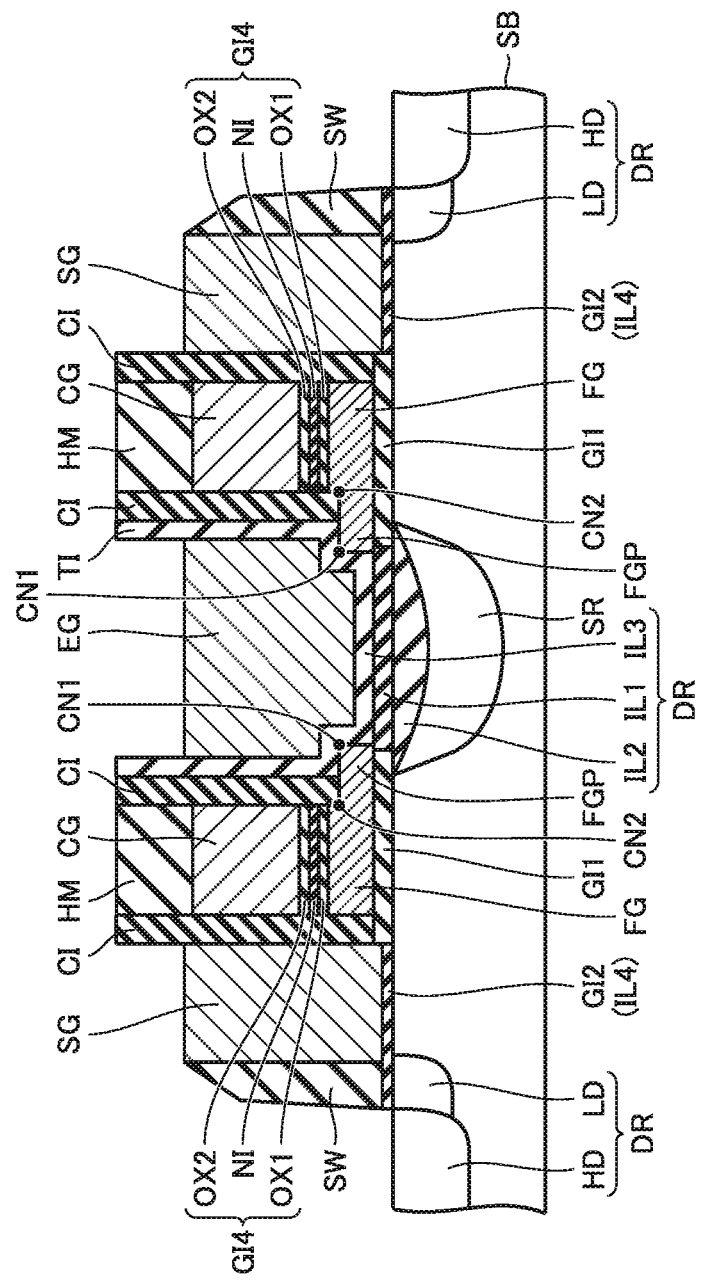
FIG. 22 is a cross-sectional view schematically showing a nineteenth step of the method of manufacturing the semiconductor device in the first embodiment.

As shown in FIG. 22, sidewall insulating film SW is formed so as to cover the sidewall of select gate SG. Then, impurity ions are implanted into the main surface of semiconductor substrate SB. High-concentration impurity region HD is thus formed in the main surface of semiconductor substrate SB. High-concentration impurity region HD and low-concentration impurity region LD form drain region DR.

Then, liner insulating film LI, interlayer insulating film II, conducting film CL and the like are formed, to manufacture the semiconductor device of this embodiment shown in FIG. 3.

Next, the operation of the semiconductor device of this embodiment is described.

As shown in FIG. 3, during writing, for example, 0.5 V is applied to drain region DR, 1 V is applied to select gate SG, 10 V is applied to control gate CG, 5 V is applied to erase gate EG, and 5 V is applied to source region SR. As a result, electrons emitted from drain region DR are accelerated by a strong electric field in a channel region between drain region DR and source region SR, forming hot electrons in a high energy state. The hot electrons are attracted by the high potential applied to control gate CG, and implanted into floating gate FG. Data is thus written into the memory cell. The state in which the electrons are retained in floating gate FG is a write state of the memory cell. A threshold voltage of the memory cell increases due to the electrons being retained in floating gate FG.

During erasure, for example, 0 V is applied to drain region DR, 0 V is applied to select gate SG, 0 V is applied to control gate CG, 11 V is applied to erase gate EG, and 0 V is applied to source region SR. As a result, the electrons stored in floating gate FG are attracted by the high potential applied to erase gate EG, and drawn into erase gate EG by the tunneling phenomenon. Here, with convex corner portion CN1 formed at the upper end of lateral protrusion FGP of floating gate FG, the electric field is concentrated at this convex corner portion CN1. Accordingly, as indicated by an outlined arrow in FIG. 3, the electrons in floating gate FG are preferentially drawn into erase gate EG through convex corner portion CN1, thereby improving drawing efficiency of the electrons from floating gate FG. The electrons retained in floating gate FG are thus drawn out, causing erasure of the data held in the memory cell. The threshold voltage of the memory cell decreases due to the electrons being drawn out of floating gate FG.

During reading, for example, 1.0 V is applied to drain region DR, 1.8 V is applied to select gate SG, 1.8 V is applied to control gate CG, 0 V is applied to erase gate EG, and 0 V is applied to source region SR. In this manner, when the memory cell is in an erase state, the threshold voltage of the memory cell is low and thus a read current flows. In contrast, when the memory cell is in a write state, the threshold voltage of the memory cell is high and thus very little read current flows. By detecting the magnitude of the read current, it can be read whether or not the memory cell is in a write state.

Figure 23A:
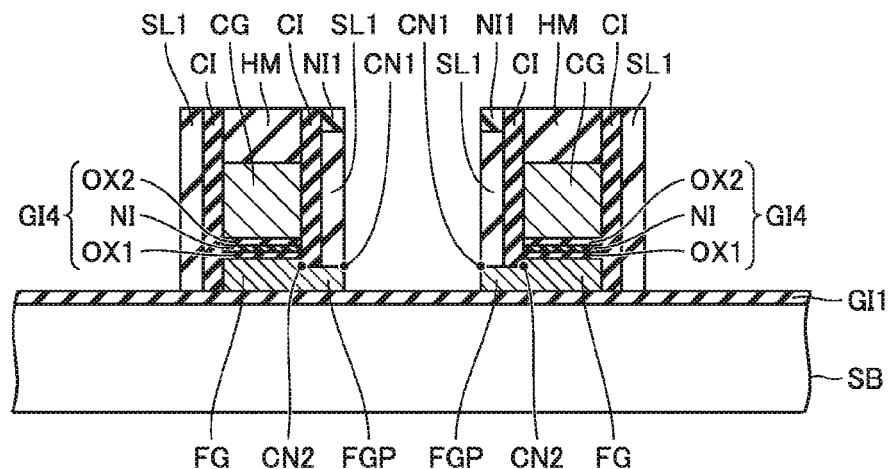
FIG. 23A is a cross-sectional view showing a first step of a method of manufacturing a semiconductor device in a comparative example.
Figure 23B:
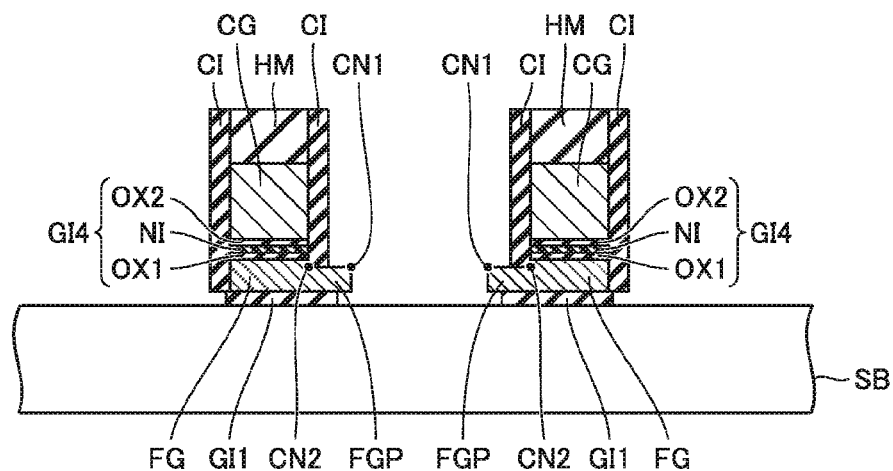
FIG. 23B is a cross-sectional view showing a second step of the method of manufacturing the semiconductor device in the comparative example.
Figure 23C:
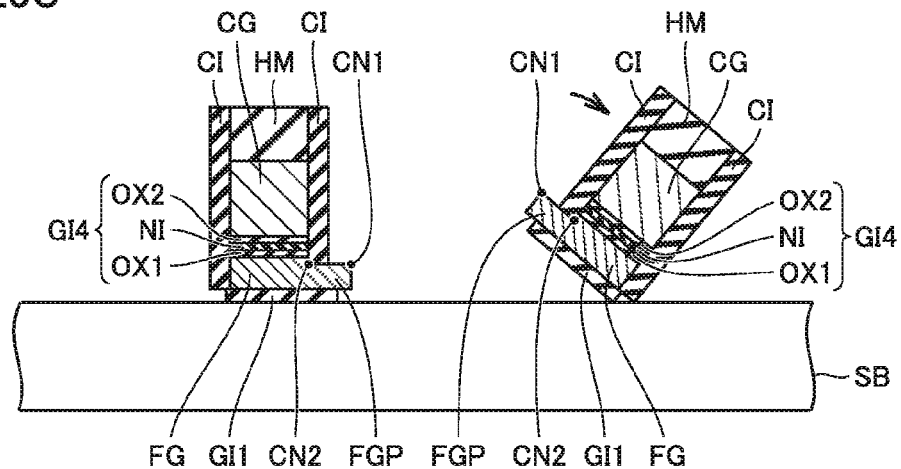
FIG. 23C is a cross-sectional view showing a third step of the method of manufacturing the semiconductor device in the comparative example.

Next, the function and effect of this embodiment is described in comparison with a comparative example shown in FIGS. 23A to 23C.

As shown in FIG. 23A, it is assumed that after the step of FIG. 10, wet etching for removing insulating film SL1 is performed without the introduction of nitrogen into gate insulating film GI1.

In this case, as shown in FIG. 23B, gate insulating film GI1 erodes in a lateral direction to a portion immediately below floating gate FG due to the above wet etching. A lateral notch thus occurs in gate insulating film GI1. Due to this notch, the gate stack structure having floating gate FG and control gate CG is supported unstably by gate insulating film GI1 on semiconductor substrate SB.

For this reason, if megasonic cleaning (ultrasonic vibration) is applied in order to effectively remove dirt and dust in acid stripping and acid cleaning steps, the gate stack structure having floating gate FG and control gate CG may collapse with respect to semiconductor substrate SB as shown in FIG. 23C.

In contrast, in this embodiment, nitrogen is introduced into gate insulating film GI1 as shown in FIG. 11. Thus, the material for nitrogen introduced portion IL1 is different from the material for insulating film SL1. Accordingly, nitrogen introduced portion IL1 is less likely to be removed even after insulating film SL1 is removed by wet etching in the steps shown in FIGS. 12 to 13. Thus, the lateral notch in gate insulating film GI1 in the region immediately below floating gate FG can be reduced. As a result, the gate stack structure is less likely to collapse if megasonic cleaning is applied.

If the material for nitrogen introduced portion IL1 is silicon oxynitride and the material for insulating film SL1 is silicon oxide, for example, it is well known that silicon oxynitride is resistant to a hydrofluoric acid (HF)-based solution. For example, the etching rate of silicon oxynitride containing nitrogen of about $1 \times 10^{21}$ atoms/cm$^3$ is approximately 20% of the etching rate of silicon oxide.

If the time for treatment with a hydrofluoric acid-based solution for removing 20 nm of insulating film SL1 is set (1 minute and 12 seconds) including an overetch time of 20%, gate insulating film GI1 having a thickness of about 10 nm will be completely removed in the above comparative example, resulting in a lateral notch having a size of between 14 and 24 nm. In contrast, when nitrogen introduced portion IL1 is silicon oxynitride as in this embodiment, the etching rate is extremely reduced, and the lateral notch is also reduced to a maximum of about 4.8 nm.

Moreover, in this embodiment, the lateral notch in gate insulating film GI1 can be reduced with the addition of a small number of steps. Specifically, only three steps should be added, namely, the step of introducing nitrogen utilizing photoresist PR3 (FIG. 10) which exists in the comparative example as well, the step of forming silicon oxynitride of thermally strong bonding by annealing thereafter, and the cleaning step added to the above annealing step. In this manner, the steps of this embodiment are compatible with the manufacturing steps of the comparative example.

Furthermore, in this embodiment, insulating film IL1 made of silicon oxynitride, for example, exists between erase gate EG and semiconductor substrate SB as shown in FIG. 3. Thus, the insulation between erase gate EG and semiconductor substrate SB as indicated by a black arrow in FIG. 3 is improved as compared to the case where only silicon oxide exists between erase gate EG and semiconductor substrate SB. This is because the physical thickness of the insulating film between erase gate EG and semiconductor substrate SB increases since insulating film IL1 itself made of silicon oxynitride remains, and because the dielectric constant increases to increase capacity since insulating film IL1 contains nitrogen.

Second Embodiment

Figure 24:
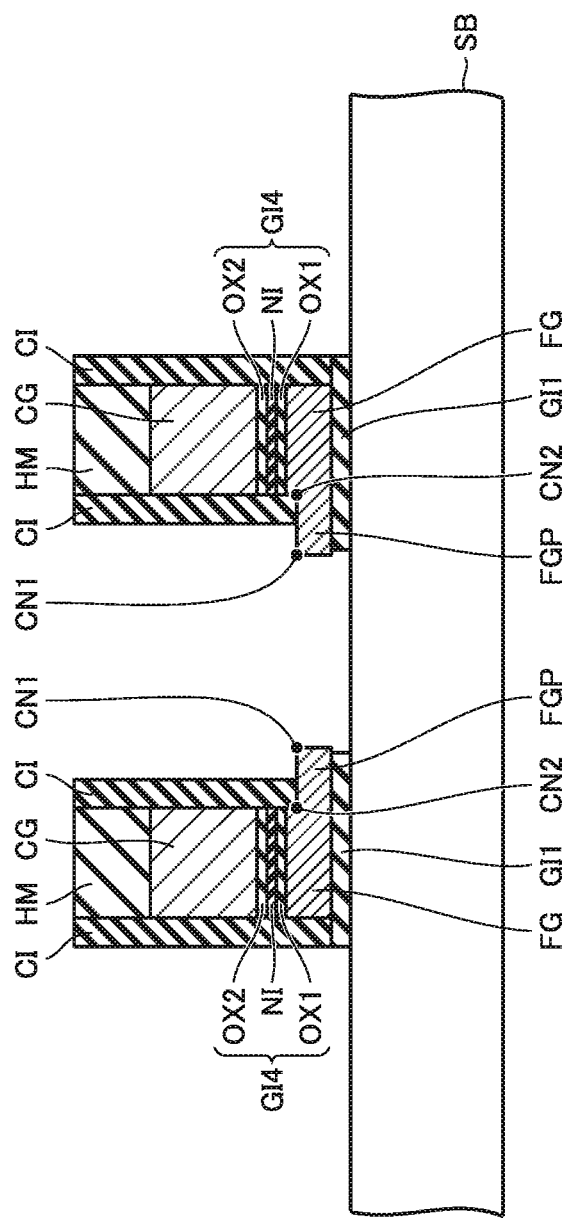
FIG. 24 is a cross-sectional view schematically showing a method of manufacturing a semiconductor device in a second embodiment.

A method of manufacturing a semiconductor device of this embodiment includes similar steps to those of the first embodiment shown in FIGS. 4 to 13. In this embodiment, after insulating film SL1 (first sidewall insulating film) is removed as shown in FIGS. 12 to 13, nitrogen introduced portion IL1 (first nitrogen introduced portion) is removed by anisotropic etching until the main surface of semiconductor substrate SB is exposed as shown in FIG. 24. Then, the manufacturing method of this embodiment includes similar steps to those of the first embodiment shown in FIGS. 14 to 22. A semiconductor device shown in FIG. 25 is thus manufactured.

Figure 25:
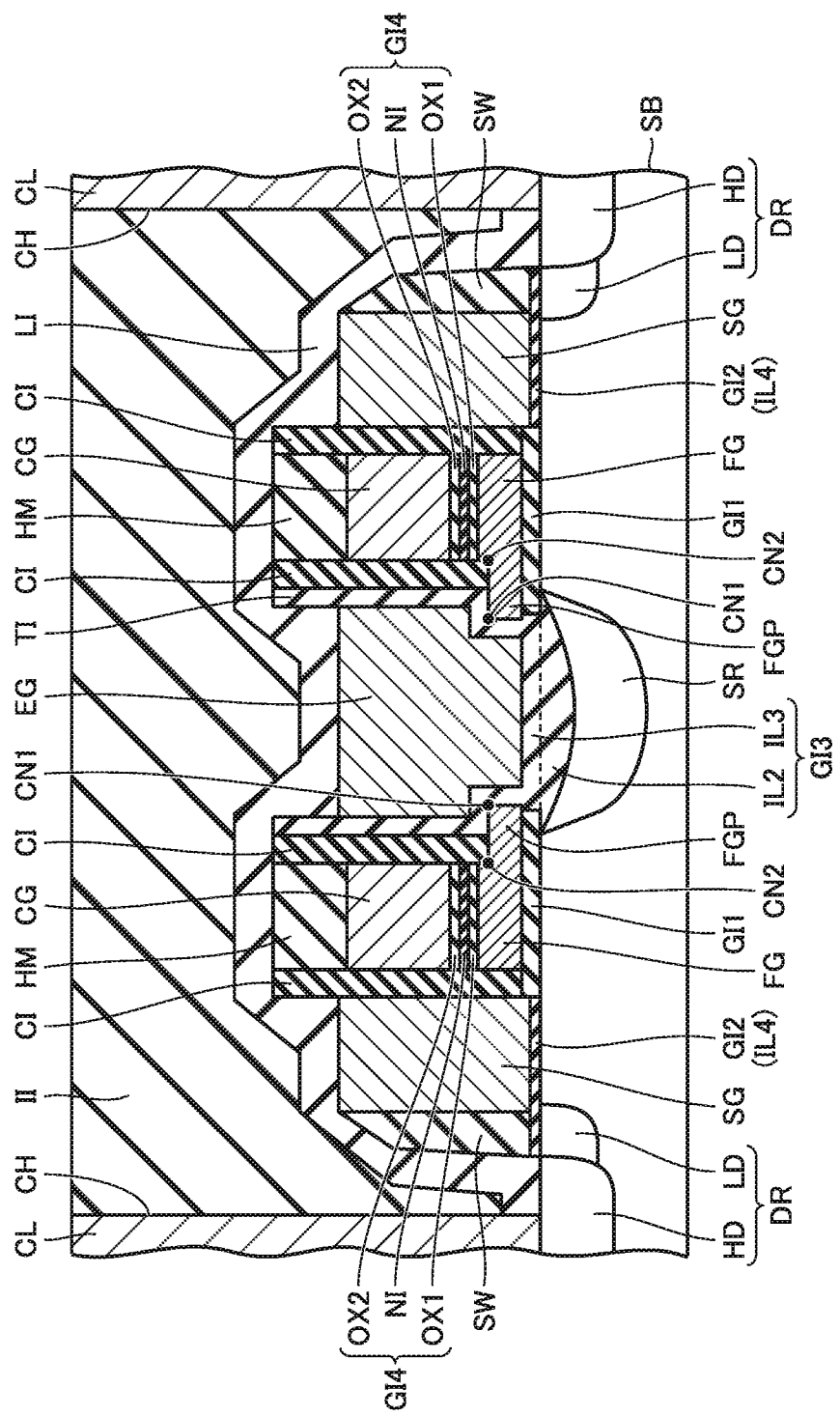
FIG. 25 is a cross-sectional view schematically showing the configuration of the semiconductor device in the second embodiment.

As shown in FIG. 25, the semiconductor device manufactured according to this embodiment does not have nitrogen introduced portion IL1 between erase gate EG and semiconductor substrate SB. Accordingly, only insulating films IL2 and IL3 made of silicon oxide, for example, exist between erase gate EG and semiconductor substrate SB.

The configuration of this embodiment is otherwise substantially the same as the configuration of the first embodiment, and thus the same elements are designated by the same characters and description thereof will not be repeated.

Again in this embodiment, as shown in FIGS. 12 to 13, nitrogen introduced portion IL1 exists during the removal of insulating film SL1. Accordingly, as in the first embodiment, nitrogen introduced portion IL1 is less likely to be removed even after insulating film SL1 is removed by wet etching in the steps shown in FIGS. 12 to 13. Thus, the lateral notch in gate insulating film GI1 in the region immediately below floating gate FG can be reduced. As a result, the gate stack structure is less likely to collapse if megasonic cleaning is applied.

Third Embodiment

Figure 26:
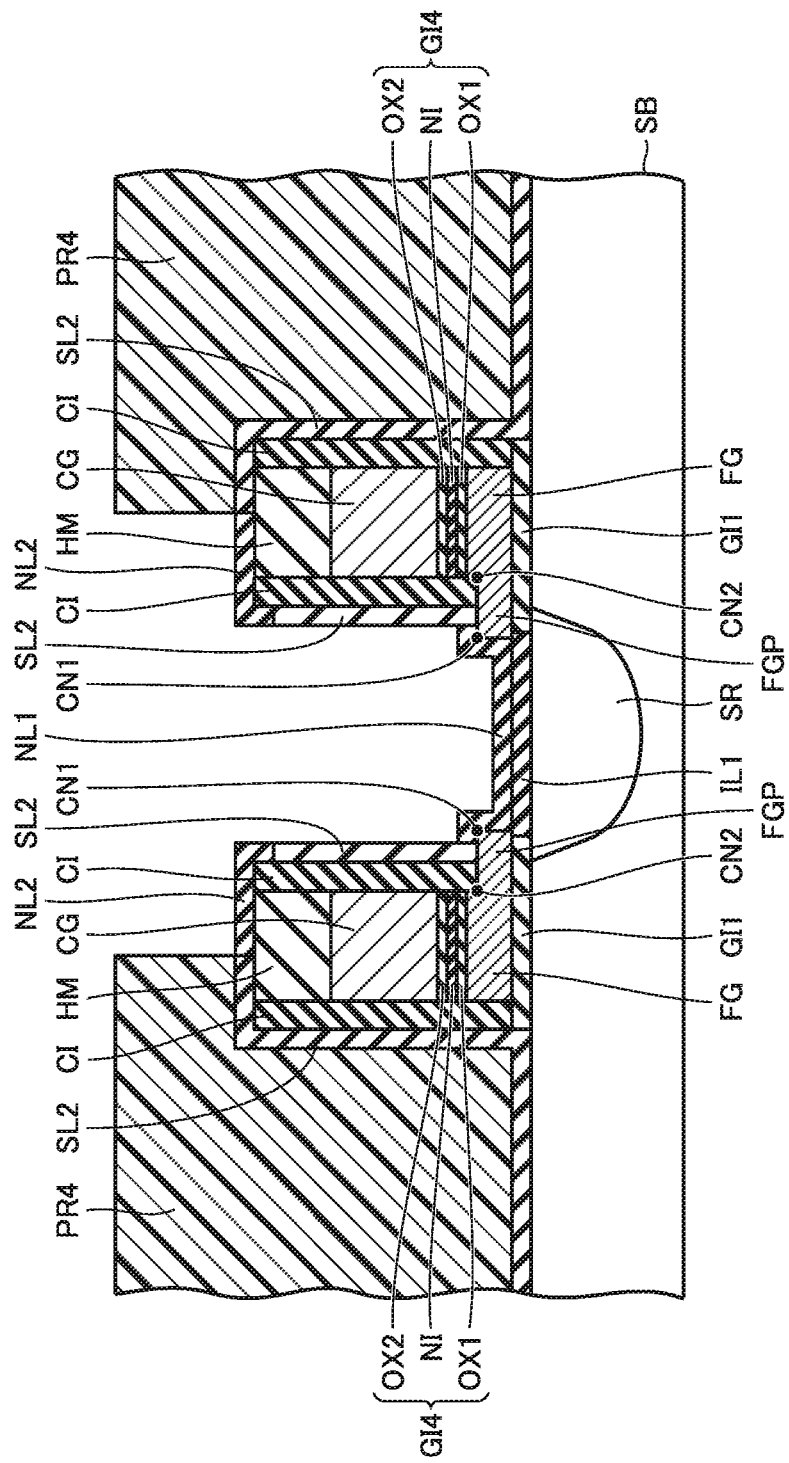
FIG. 26 is a cross-sectional view schematically showing a first step of a method of manufacturing a semiconductor device in a third embodiment.

A method of manufacturing a semiconductor device of this embodiment includes similar steps to those of the first embodiment shown in FIGS. 4 to 14. After source region SR is formed in FIG. 14, in this embodiment, nitrogen is introduced into insulating film SL2 as shown in FIG. 26.

As the conditions for the nitrogen introduction, average projection range Rp is between 50 nm and 90 nm, and implantation energy is between 8 keV and 15 keV, for example. As the conditions for the nitrogen implantation described above, an implantation angle is 0 degree, and a dose amount is between $1 \times 10^{15}$ atoms/cm$^2$ and $5 \times 10^{15}$ atoms/cm$^2$, for example.

As a result, a nitrogen introduced portion NL1 (partial nitrogen introduced portion) and a nitrogen introduced portion NL2 are formed in a portion of insulating film SL2. Nitrogen introduced portion NL1 is formed to be located on the upper surface of nitrogen introduced portion IL1, and also to be located on the side surface of lateral protrusion FGP of floating gate FG. Nitrogen introduced portion NL2 is formed to be located in a portion of insulating film SL2 on hard mask layer HM and on insulating film CI. These nitrogen introduced portions NL1 and NL2 are silicon oxynitride, for example. Then, photoresist PR4 is removed by acid stripping, ashing and the like, for example. If photoresist PR4 is removed by acid stripping, for example, megasonic cleaning can be applied.

Figure 27:
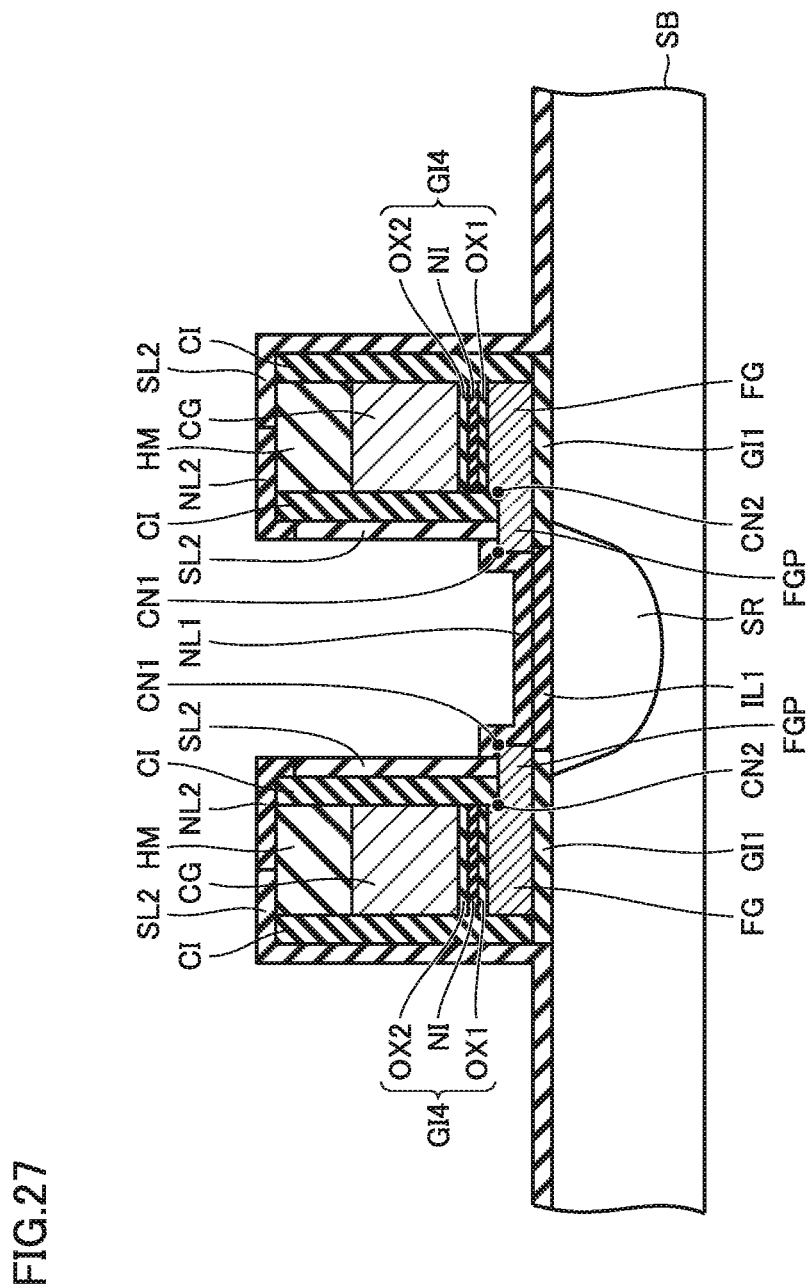
FIG. 27 is a cross-sectional view schematically showing a second step of the method of manufacturing the semiconductor device in the third embodiment.

As shown in FIG. 27, as a result of the removal of photoresist PR4 described above, a portion of insulating film SL2 that has been covered with photoresist PR4 is exposed. Annealing is then performed. This annealing takes place so as to form silicon oxynitride of thermally strong bonding in nitrogen introduced portions NL1 and NL2. The above annealing is performed in a nitrogen atmosphere, for example, at a temperature of between 950° C. and 1010° C. for a period of between 10 seconds and 60 seconds.

Figure 28:
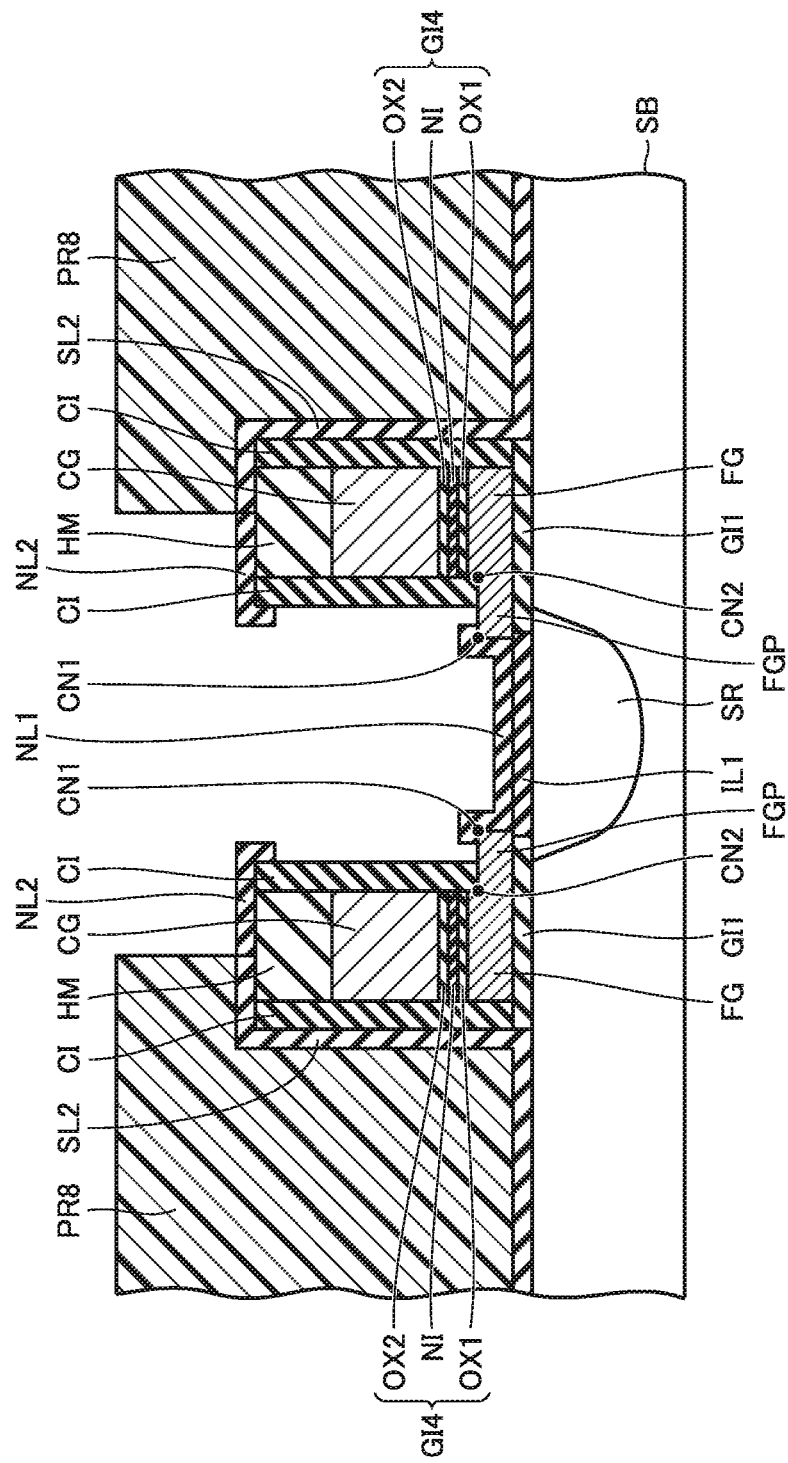
FIG. 28 is a cross-sectional view schematically showing a third step of the method of manufacturing the semiconductor device in the third embodiment.

As shown in FIG. 28, a photoresist PR8 is then applied. This photoresist PR8 is patterned by exposure, development and the like. Wet etching is performed with patterned photoresist PR8 as a mask. As a result of this wet etching, a portion of insulating film SL2 exposed at photoresist PR8 other than the portions of nitrogen introduced portions NL1 and NL2 is selectively removed.

Then, photoresist PR8 is removed by acid stripping, ashing and the like, for example. If photoresist PR8 is removed by acid stripping, for example, megasonic cleaning can be applied. Then, nitrogen introduced portions NL1 and NL2 are removed.

Figure 29:
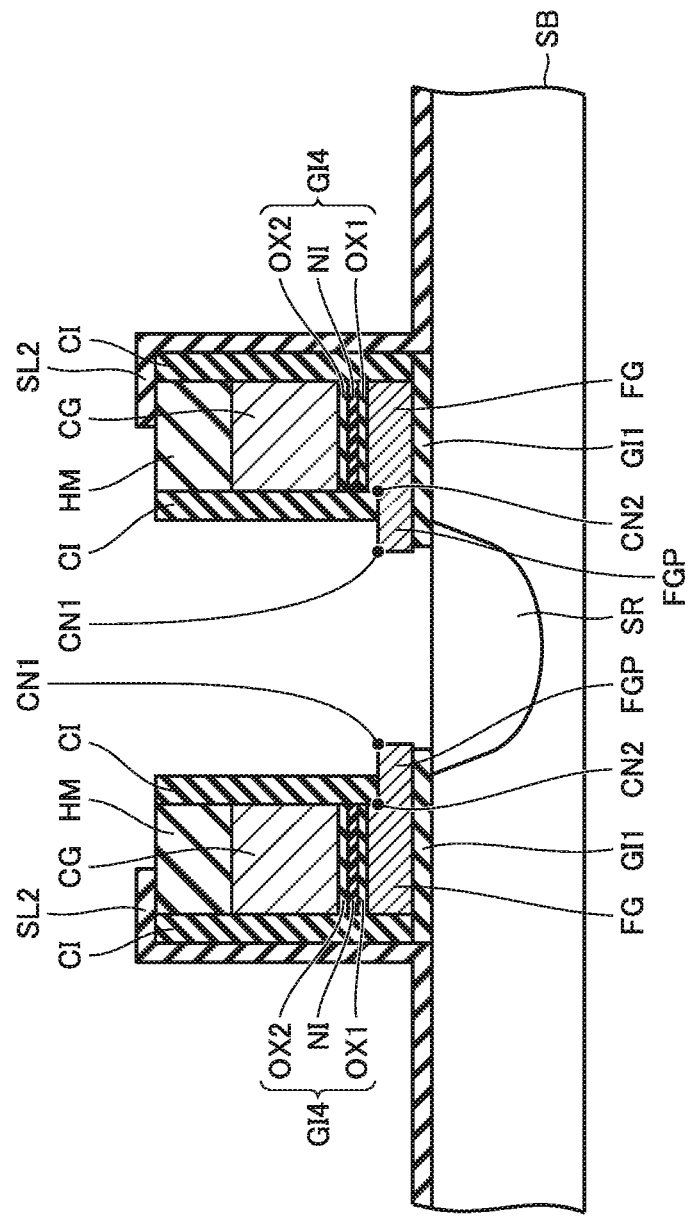
FIG. 29 is a cross-sectional view schematically showing a fourth step of the method of manufacturing the semiconductor device in the third embodiment.

As shown in FIG. 29, as a result of the removal of nitrogen introduced portions NL1 and NL2 described above, the side surface of lateral protrusion FGP of floating gate FG is exposed.

Then, similar steps to those of the first embodiment shown in FIGS. 16 to 22 are performed. A semiconductor device having a similar configuration to that of the second embodiment shown in FIG. 25 is thus manufactured.

In this embodiment, during the removal of insulating film SL2 shown in FIGS. 27 to 28, in addition to nitrogen introduced portion IL1 being located lateral to gate insulating film GI1, the side surface of lateral protrusion FGP of floating gate FG is covered with nitrogen introduced portion NL1. Accordingly, the occurrence of a lateral notch in gate insulating film GI1 in the region immediately below floating gate FG can be reduced during the removal of insulating film SL2.

Moreover, in this embodiment, also during the removal of photoresist PR8 shown in FIG. 28, in addition to nitrogen introduced portion IL1 being located lateral to gate insulating film GI1, the side surface of lateral protrusion FGP of floating gate FG is covered with nitrogen introduced portion NL1. Accordingly, the occurrence of a lateral notch in gate insulating film GI1 in the region immediately below floating gate FG can be reduced also during the removal of photoresist PR8.

Fourth Embodiment

Figure 30:
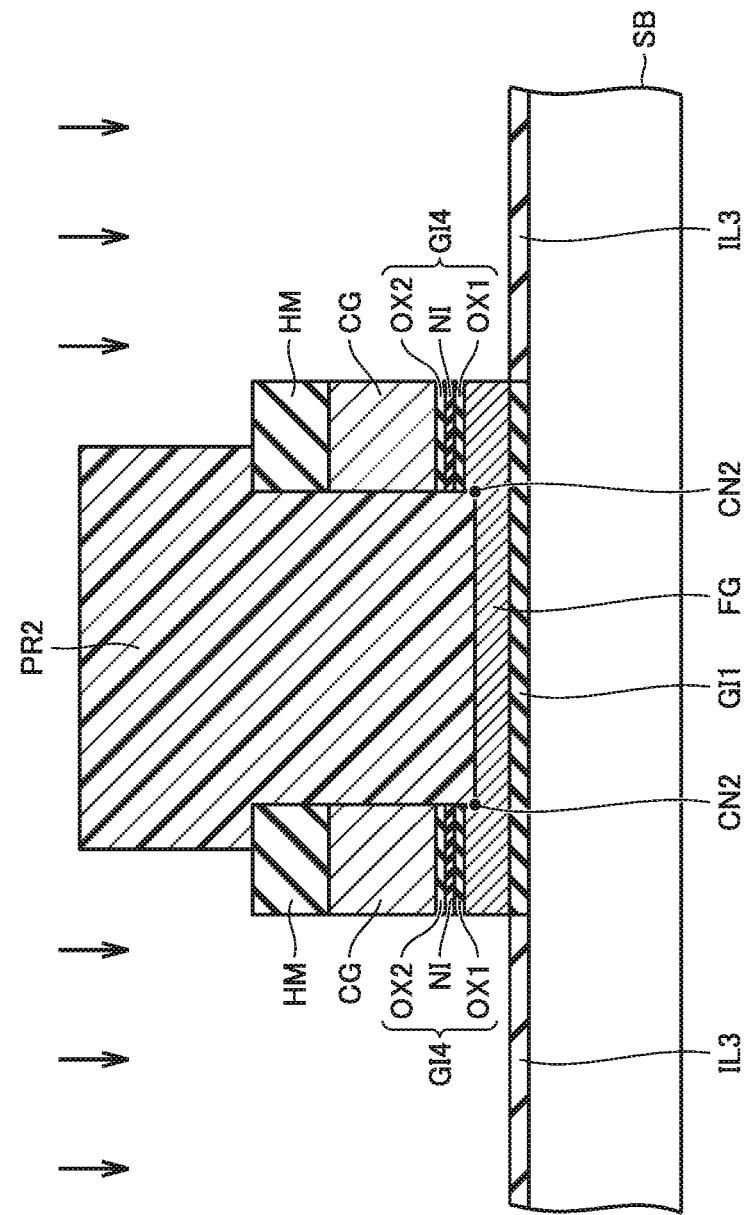
FIG. 30 is a cross-sectional view schematically showing a method of manufacturing a semiconductor device in a fourth embodiment.

A method of manufacturing a semiconductor device of this embodiment includes similar steps to those of the first embodiment shown in FIGS. 4 to 7. Then, in this embodiment, as shown in FIG. 30, nitrogen is introduced into gate insulating film GI1 exposed at photoresist PR2 and the gate stack structure (that is, a portion of gate insulating film GI1 exposed at conducting film FG for floating gate at the other sidewall side of control gate CG).

As the conditions for the nitrogen introduction, average projection range Rp is between 8 nm and 30 nm, and implantation energy is between 1 keV and 5 keV, for example. In addition, as the conditions for the nitrogen implantation described above, an implantation angle is 0 degree, and a dose amount is between $1 \times 10^{15}$ atoms/cm$^2$ and $5 \times 10^{15}$ atoms/cm$^2$, for example.

As a result, a nitrogen introduced portion IL3 (second nitrogen introduced portion) is formed in a portion of gate insulating film GI1. This nitrogen introduced portion IL3 is silicon oxynitride, for example. Then, photoresist PR2 is removed by acid stripping, ashing and the like, for example.

Then, the manufacturing method of this embodiment includes similar steps to those of the first embodiment shown in FIGS. 8 to 22. A semiconductor device shown in FIG. 31 is thus manufactured.

Figure 31:
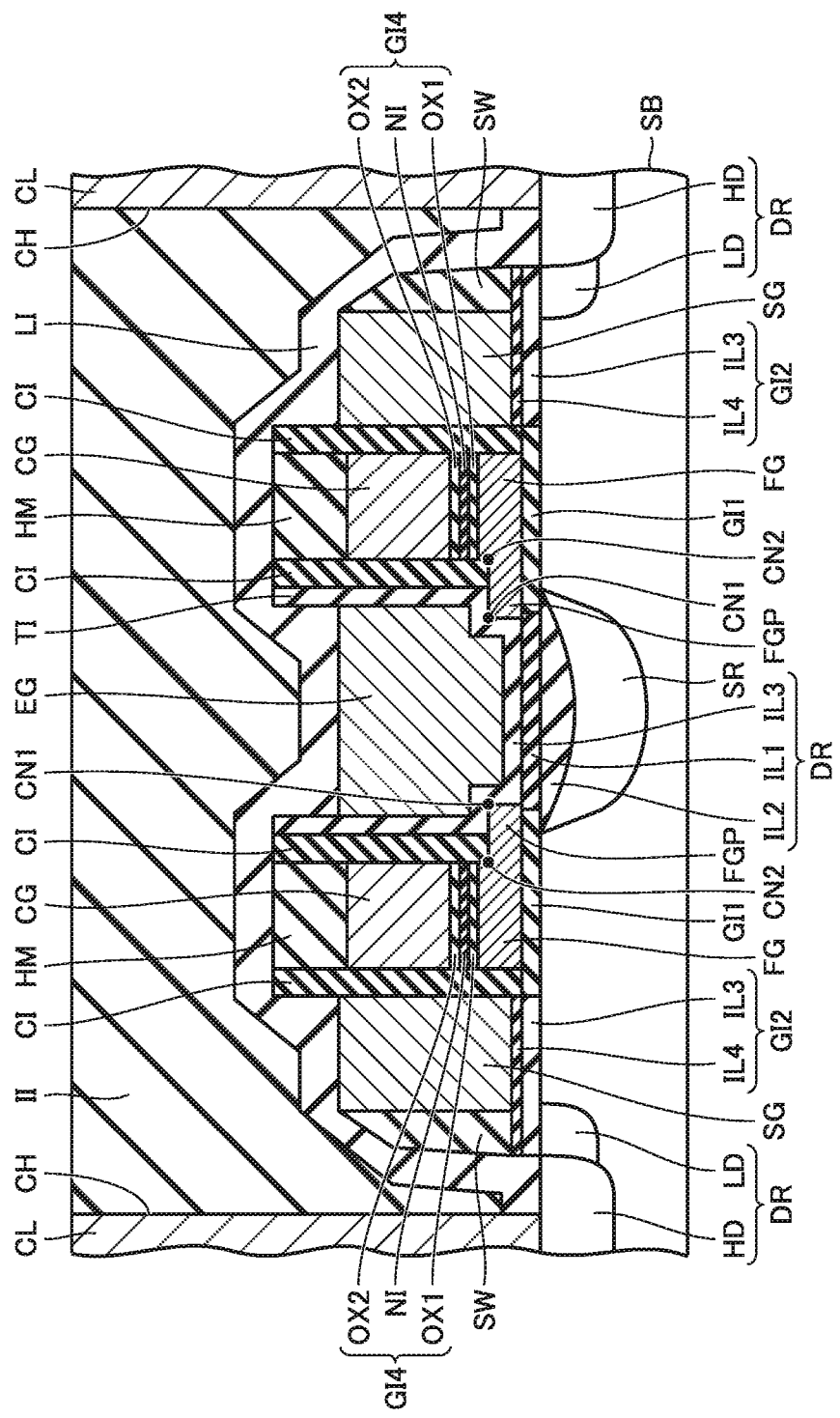
FIG. 31 is a cross-sectional view schematically showing the configuration of the semiconductor device in the fourth embodiment.

As shown in FIG. 31, the configuration of the semiconductor device manufactured according to this embodiment is different from the configuration of the first embodiment shown in FIG. 3 in terms of the configuration of gate insulating film GI2 located immediately below select gate SG.

As shown in FIG. 31, in this embodiment, gate insulating film GI2 has a two-layer structure of nitrogen introduced portion IL3 and insulating film IL4. Nitrogen introduced portion IL3 is made of silicon oxynitride, for example. Insulating film IL4 is in contact with the upper surface of nitrogen introduced portion IL3, and is made of silicon oxide, for example. Gate insulating film GI2 thus has a portion made of a material different from that of gate insulating film GI1 in that gate insulating film GI2 includes nitrogen introduced portion IL3.

The configuration of this embodiment is otherwise substantially the same as the configuration of the first embodiment, and thus the same elements are designated by the same characters and description thereof will not be repeated.

In this embodiment, as shown in FIG. 31, nitrogen introduced portions IL1 and IL3 exist at opposite sides of gate insulating film GI1. Accordingly, nitrogen introduced portions IL1 and IL3 are less likely to be removed even after insulating film SL1 is removed by wet etching in the steps shown in FIGS. 12 to 13. Thus, the lateral notch at opposite sides of gate insulating film GI1 in the region immediately below floating gate FG can be reduced. As a result, the gate stack structure is even less likely to collapse if megasonic cleaning is applied.

While the material for each of gate insulating film GI1 and insulating film SL1 has been described as silicon oxide in the above embodiments, the material for each of gate insulating film GI1 and insulating film SL1 may be a high-dielectric constant insulating material (for example, hafnium oxide, tantalum oxide).

In addition, while the material for each of nitrogen introduced portions IL1 and IL3 has been described as silicon oxynitride, if the material for each of gate insulating film GI1 and insulating film SL1 is a high-dielectric constant insulating material (for example, hafnium oxide, tantalum oxide), nitrogen may be introduced into the high-dielectric constant insulating material.

In addition, the etching rate of insulating film SL1 may be faster than that of gate insulating film GI1.

Although the invention made by the present inventors has been specifically described based on the embodiments, it goes without saying that the present invention is not limited to the embodiments described above, but can be modified in various ways within the gist of the present invention.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A method of manufacturing a semiconductor device, comprising the steps of:
    forming a gate insulating film on a main surface of a semiconductor substrate;
    forming a conducting film for floating gate on the gate insulating film;
    forming a control gate on the conducting film for floating gate with a first insulating film interposed therebetween;
    forming a first sidewall insulating film made of the same material as that of the gate insulating film, so as to cover one sidewall of the control gate on the conducting film for floating gate;
    by selectively removing the conducting film for floating gate with the first sidewall insulating film as a mask, forming a floating gate from the conducting film for floating gate, and exposing a portion of the gate insulating film at the floating gate;
    forming a first nitrogen introduced portion by introducing nitrogen into the exposed portion of the gate insulating film;
    after forming the first nitrogen introduced portion, removing the first sidewall insulating film to expose an upper surface of a lateral protrusion of the floating gate protruding laterally from a region immediately below the control gate; and forming an erase gate so as to face the upper surface and a side surface of the lateral protrusion.

2. The method of manufacturing a semiconductor device according to claim 1, further comprising the step of, after removing the first sidewall insulating film, removing the first nitrogen introduced portion by anisotropic etching until the main surface of the semiconductor substrate is exposed.

3. The method of manufacturing a semiconductor device according to claim 1, further comprising the steps of:

after exposing an upper surface of the floating gate, forming a second insulating film so as to cover the floating gate, the control gate and the first nitrogen introduced portion;

after forming the second insulating film, forming a source region by implanting an impurity into the semiconductor substrate; and after forming the source region, forming a partial nitrogen introduced portion by introducing nitrogen into the second insulating film located on the side surface of the lateral protrusion of the floating gate.

4. The method of manufacturing a semiconductor device according to claim 3, further comprising the step of removing a portion of the second insulating film other than the partial nitrogen introduced portion.

5. The method of manufacturing a semiconductor device according to claim 4, further comprising the step of, after removing the portion of the second insulating film other than the partial nitrogen introduced portion, removing the partial nitrogen introduced portion and the first nitrogen introduced portion.

6. The method of manufacturing a semiconductor device according to claim 1, further comprising the step of, after forming the control gate and before forming the first sidewall insulating film, forming a second nitrogen introduced portion by introducing nitrogen into a portion of the gate insulating film exposed at the conducting film for floating gate at the other sidewall side of the control gate.

7. The method of manufacturing a semiconductor device according to claim 1, wherein the step of forming the erase gate includes the step of forming a select gate across the floating gate from the erase gate.

\* \* \* \* \*